(12) United States Patent
Hsu

(10) Patent No.: US 10,840,300 B2
(45) Date of Patent: Nov. 17, 2020

(54) 3D VERTICAL MEMORY ARRAY CELL STRUCTURES WITH INDIVIDUAL SELECTORS AND PROCESSES

(71) Applicant: Fu-Chang Hsu, San Jose, CA (US)

(72) Inventor: Fu-Chang Hsu, San Jose, CA (US)

( * ) Notice: Subject to any disclaimer, the term of this patent is extended or adjusted under 35 U.S.C. 154(b) by 0 days.

(21) Appl. No.: 16/221,385

(22) Filed: Dec. 14, 2018

(65) Prior Publication Data

US 2019/0198569 A1 Jun. 27, 2019

Related U.S. Application Data

(63) Continuation-in-part of application No. 15/360,895, filed on Nov. 23, 2016, now Pat. No. 10,483,324.

(60) Provisional application No. 62/259,589, filed on Nov. 24, 2015, provisional application No. 62/771,153, filed on Nov. 25, 2018, provisional application No. 62/599,694, filed on Dec. 16, 2017.

(51) Int. Cl.
*H01L 27/24* (2006.01)
*H01L 27/22* (2006.01)
*H01L 45/00* (2006.01)
*G11C 13/00* (2006.01)

(52) U.S. Cl.
CPC ........ *H01L 27/249* (2013.01); *G11C 13/0004* (2013.01); *H01L 27/224* (2013.01); *H01L 27/2409* (2013.01); *H01L 45/1683* (2013.01); *G11C 2213/71* (2013.01); *G11C 2213/72* (2013.01); *H01L 45/04* (2013.01); *H01L 45/06* (2013.01); *H01L 45/126* (2013.01); *H01L 45/1226* (2013.01); *H01L 45/146* (2013.01)

(58) Field of Classification Search
CPC .. H01L 27/249; H01L 27/224; H01L 27/2409
See application file for complete search history.

(56) References Cited

U.S. PATENT DOCUMENTS

| | | |
|---|---|---|
| 2012/0099367 A1 | 4/2012 | Azuma et al. |
| 2012/0313072 A1 | 12/2012 | Baek et al. |
| 2014/0043911 A1 | 2/2014 | Samachisa et al. |

(Continued)

OTHER PUBLICATIONS

International Search Report, dated Feb. 15, 2017 for corresponding International Application No. PCT/US2016/063683.

(Continued)

*Primary Examiner* — Errol V Fernandes
(74) *Attorney, Agent, or Firm* — Intellectual Property Law Group LLP

(57) ABSTRACT

Three-dimensional vertical memory array cell structures and processes. In an exemplary embodiment, a 3D vertical memory array structure is formed by performing operations that include forming an array stack having alternating metal layers and insulator layers, forming a hole through the array stack to expose internal surfaces of the metal layers and internal surfaces of the insulator layers, and performing a metal-oxidation process on the internal surfaces of the metal layers to form selector devices on the internal surfaces of the metal layers. The operations also include depositing one of resistive material or phase-change material within the hole on the selector devices and the internal surfaces of the insulator layers, such that the hole is reduced to a smaller hole, and depositing conductor material in the smaller hole.

17 Claims, 29 Drawing Sheets

(56) References Cited

U.S. PATENT DOCUMENTS

| | | |
|---|---|---|
| 2016/0071860 A1 | 3/2016 | Kai et al. |
| 2016/0079257 A1* | 3/2016 | Sonehara .......... H01L 27/11582 257/324 |
| 2016/0079530 A1 | 3/2016 | Kim et al. |
| 2016/0111434 A1 | 4/2016 | Pachamuthu et al. |
| 2016/0133866 A1 | 5/2016 | Li et al. |
| 2017/0092505 A1* | 3/2017 | Nakao ................. H01L 23/5226 |
| 2017/0125483 A1 | 5/2017 | Tanaka |
| 2017/0141161 A1 | 5/2017 | Sakotsubo |
| 2018/0102375 A1 | 4/2018 | Pang et al. |

OTHER PUBLICATIONS

Written Opinion of the ISA, dated Feb. 15, 2017 for corresponding International Application No. PCT/US2016/063683.

International Search Report, dated Mar. 5, 2019, for corresponding International Application No. PCT/US2018/065857.

Written Opinion of the International Searching Authority, dated Mar. 5, 2019, for corresponding International Application No. PCT/US2018/065857.

* cited by examiner

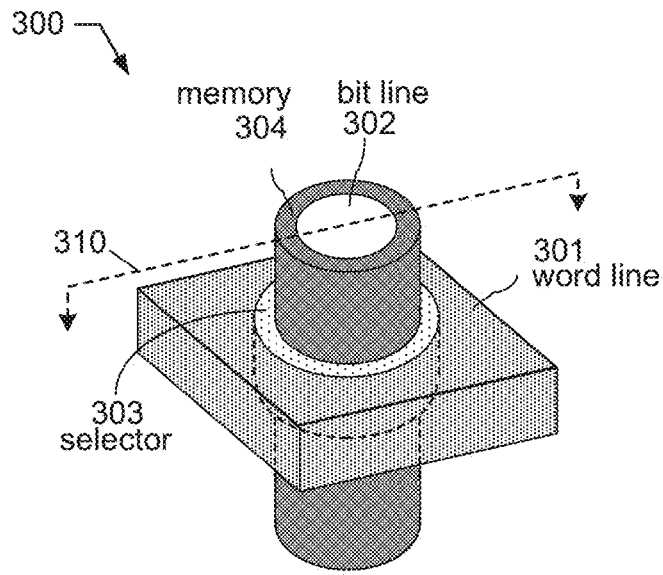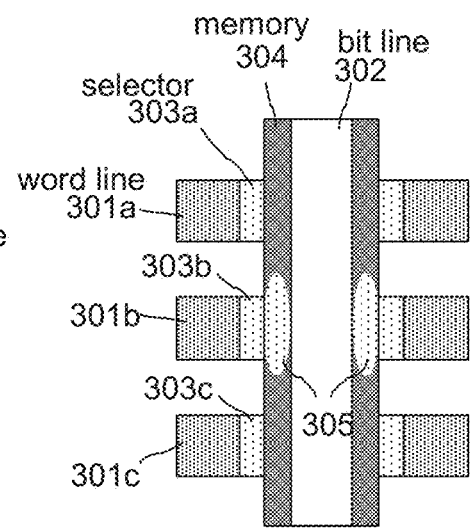
FIG. 3A FIG. 3B
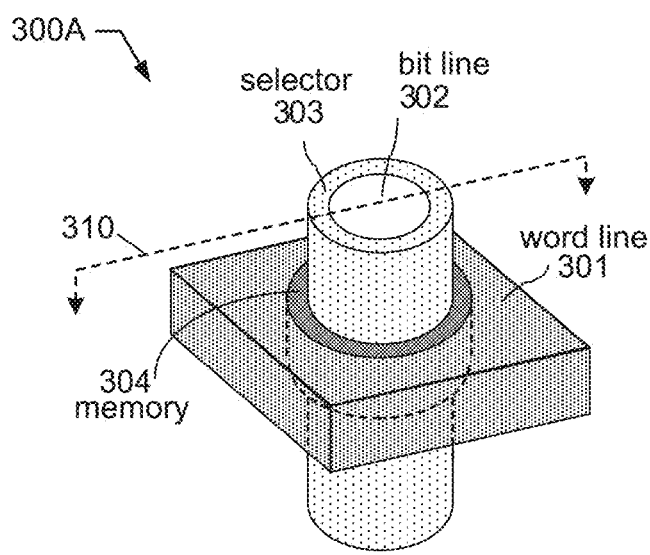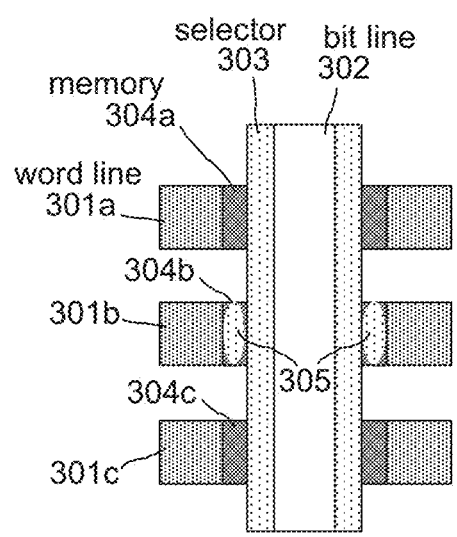
FIG. 3C FIG. 3D

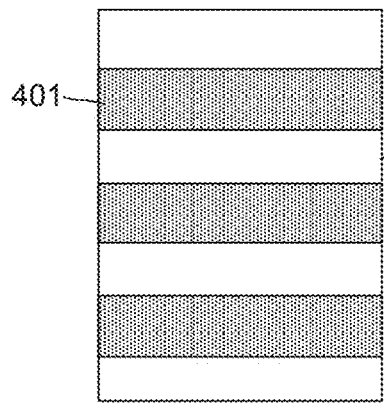
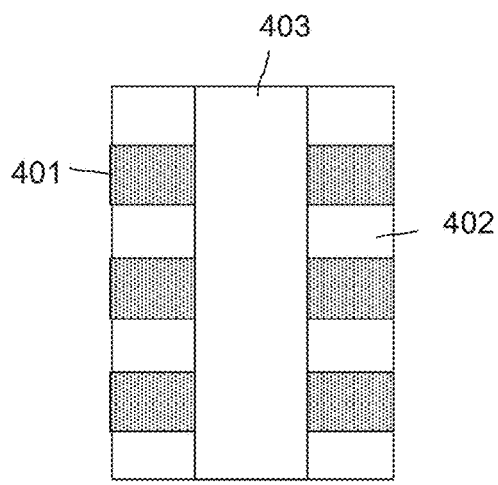
FIG. 4A
FIG. 4B
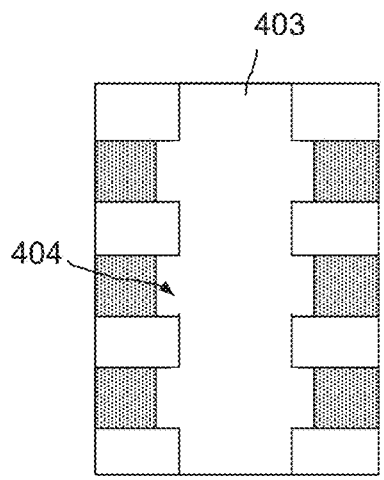
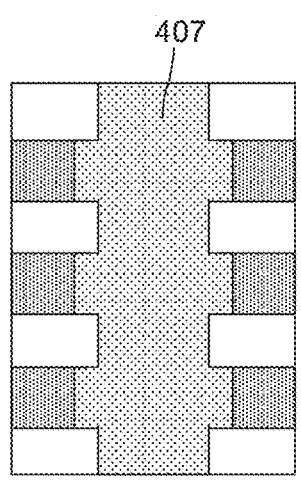
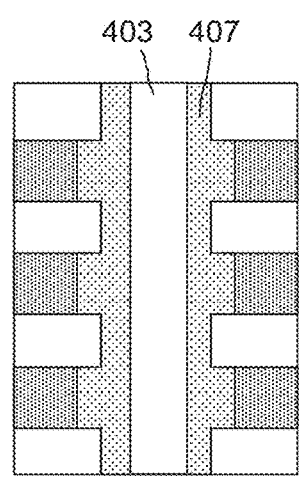
FIG. 4C
FIG. 4D
FIG. 4D1
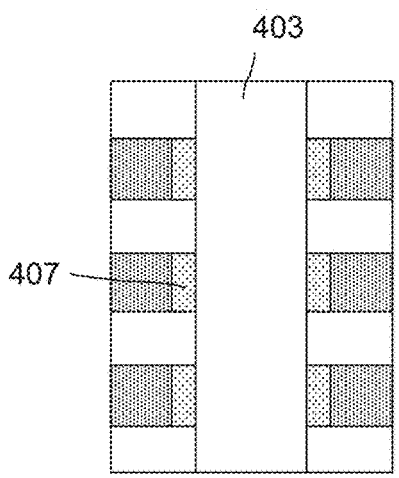
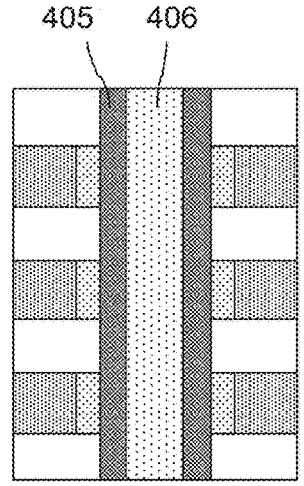
FIG. 4E
FIG. 4F

INDIVIDUAL SELECTORS
FORMED BY METAL-OXIDATION

3D VERTICAL MEMORY ARRAY CELL STRUCTURES WITH INDIVIDUAL SELECTORS AND PROCESSES

CLAIM TO PRIORITY

This Application is a continuation-in-part (CIP) of U.S. patent application Ser. No. 15/360,895, filed on Nov. 23, 2016, and entitled "3D VERTICAL MEMORY ARRAY CELL STRUCTURES AND PROCESSES." The application Ser. No. 15/360,895 claims the benefit of priority based upon U.S. Provisional Patent Application No. 62/259,589, filed on Nov. 24, 2015, and entitled "3D VERTICAL ARRAY CELL STRUCTURES FOR RRAM, PCM, AND OTHER MEMORIES," which is hereby incorporated herein by reference in its entirety.

This application claims the benefit of priority based upon U.S. Provisional Patent Application No. 62/771,153, filed on Nov. 25, 2018, and entitled "3D ARRAY STRUCTURE AND PROCESS FOR RESISTIVE OR PHASE-CHANGE TYPE OF DEVICES," which is hereby incorporated herein by reference in its entirety.

This application claims the benefit of priority based upon U.S. Provisional Patent Application No. 62/599,694, filed on Dec. 16, 2017, and entitled "3D ARRAY STRUCTURE AND PROCESS FOR RESISTIVE OR PHASE-CHANGE TYPE OF DEVICES," which is hereby incorporated herein by reference in its entirety.

FIELD OF THE INVENTION

The exemplary embodiments of the present invention relate generally to the field of semiconductors and integrated circuits, and more specifically to memory and storage devices.

BACKGROUND OF THE INVENTION

In 3D high density memory, a vertical array where the word lines run horizontally and the bit lines run vertically (or vice versa) is preferred over a cross-point array where both word lines and bit lines run horizontally. For example, in a vertical array, the word lines run in a plane that is perpendicular to the plane of the bit lines, while in a cross point array the word lines and bit lines run in the same or parallel planes. A 3D vertical array can be formed by etching through multiple deposited layers together, which can significantly reduce manufacturing cost. In contrast, a 3D cross-point array requires a pattern-etch process performed layer by layer, and thus the manufacturing costs are higher.

One problem associated with implementing a 3D array is referred to as a "sneak leakage path" problem. A sneak leakage path allows current to flow on a word line associated with an off memory cell. Though there are techniques to address this problem in 3D cross point arrays, an effective solution for 3D vertical arrays is desired.

FIG. 1A shows a conventional vertical cell string structure having a horizontal electrode (word line) 101, a vertical electrode (bit line) 102, and a selector 103. The selector 103 is used to control current flow direction on the word lines. A typical selector may be a P-N diode, Schottky diode, or other material with threshold behavior for current flow direction. Also shown is a memory element 104, which may be resistive switching material, phase-change material, and/ or others depending on the memory type.

Unfortunately, this conventional vertical cell structure exhibits the 'sneak leakage path' problem. Because this cell's selector layer 103 is connected to adjacent cells and the selector is normally a conductor, current can leak through the selector layer 103 to an unselected cell's word line, which is defined as sneak path leakage.

FIG. 1B shows a cross-sectional view of the conventional vertical cell structure shown in FIG. 1A taken at cross-section line 110. As shown in FIG. 1B, there are three horizontal word lines 101a, 101b, and 101c and one vertical bit line 102. Assuming a selected cell on word line 101b is an off cell, the memory element 105 has very high resistance. Because the selector layer 103 is a conductor, current can leak (as shown at path 109) from the bit line 102 through the selector layer 103 from an adjacent on-cell on word line 101a to the word line 101b of the off-cell, and thus cause read errors. For example, the current path 109 shows how current may flow from the bit linen 102 through the selector 103 to the unselected word line 101b due to the sneak leakage path problem.

FIG. 2A shows another conventional vertical cell structure having a horizontal electrode (word line) 201, a vertical electrode (bit line) 202, a selector 203, and a memory 204. FIG. 2B shows a cross-sectional view of the vertical cell structure shown in FIG. 2A taken at cross-section line 210. Similar to the cell structure shown in FIG. 1B, the sneak leakage path problem can exist in the cell structure shown in FIG. 2B as well. For example, referring to FIG. 2B, the cell structure includes horizontal word lines 201a, 201b, and 201c and one vertical bit line 202. It will be assumed that a cell on word line 201b is an off cell such that memory element 205 has very high resistance. Due to the fact that selector layer 203 is a conductor, the current can leak (as show at path 209) from the bit line 202 through the selector layer 203 from an adjacent on-cell on word line 201a to the word line 201b of the off-cell, and thus cause read errors.

Therefore, it is desirable to have cell structures and process flows to form 3D vertical memory arrays to eliminate or reduce the sneak leakage path problem.

SUMMARY

In various exemplary embodiments, several novel cell structures and process flows suitable to form 3D vertical memory arrays are disclosed. In one embodiment, the cell structures comprise individual selectors for each memory cell to eliminate or reduce the sneak leakage path problem. Exemplary process flows are disclosed to form the novel cell structures.

The exemplary embodiments are suitable for use with 3D vertical memory cells and array structures, such as RRAM (resistive random-access memory), PCM (phase change memory), MRAM (magnetic random-access memory), FRAM (ferroelectric random-access memory), anti-fuse OTP NVM (one-time programmable non-volatile memory), and many others.

In an exemplary embodiment, a vertical cell structure is provided that includes a word line, a selector layer, and a memory layer. The word line, the selector layer, and the memory layer form a vertical cell structure in which at least one of the selector layer and the memory layer are segmented to form a segment that blocks sneak path leakage current on the word line.

In an exemplary embodiment, a method is provided for forming a vertical cell structure and includes forming a layer stack comprising word line layers and insulator layers and forming an opening through the layer stack to expose internal surfaces of the word line layers. The method also comprises depositing a first material on the internal surfaces of the word line layers. The first material is one of selector material and memory material and the operation of depositing forms segments of the first material. Each segment is deposited on a corresponding internal surface of a respective word line layer. The method also includes depositing a second material on the first material. The second material is one of the selector material and the memory material that is not used as the first material. The method also includes depositing bit line material on the second material.

In an exemplary embodiment, a 3D vertical array is provided that includes a plurality of cell structures that block sneak path leakage current. The cell structures are formed by performing the operations of forming a layer stack comprising word line layers and insulator layers, and forming an opening through the layer stack to expose internal surfaces of the word line layers. The cell structures are further formed by performing an operation of depositing a first material on the internal surfaces of the word line layers. The first material is one of selector material and memory material. The depositing forms segments of the first material, and each segment is deposited on a corresponding internal surface of a respective word line layer. The cell structures are further formed by performing the operations of depositing a second material on the first material, where the second material is one of the selector material and the memory material that is not used as the first material, and depositing bit line material on the second material.

In an exemplary embodiment, a 3D vertical memory array structure is formed by performing operations that include forming an array stack having alternating metal layers and insulator layers, forming a hole through the array stack to expose internal surfaces of the metal layers and internal surfaces of the insulator layers, and performing a metal-oxidation process on the internal surfaces of the metal layers to form selector devices on the internal surfaces of the metal layers. The operations also include depositing one of resistive material or phase-change material within the hole on the selector devices and the internal surfaces of the insulator layers, such that the hole is reduced to a smaller hole, and depositing conductor material in the smaller hole.

In an exemplary embodiment, a 3D vertical memory array structure is provided that comprises an array stack having alternating metal layers and insulator layers. The array stack includes a hole that exposes internal surfaces of the metal layers and internal surfaces of the insulator layers. The structure also includes metal-oxidation on the internal surfaces of the metal layers that forms selector devices on the internal surfaces of the metal layers, and one of resistive material or phase-change material within the hole and coupled to the selector devices, and wherein the hole is reduced to a smaller hole. The structure also includes conductor material in the smaller hole and coupled to the resistive material or the phase-change material.

Additional features and benefits of the exemplary embodiments of the present invention will become apparent from the detailed description, figures and claims set forth below.

BRIEF DESCRIPTION OF THE DRAWINGS

The exemplary embodiments of the present invention will be understood more fully from the detailed description given below and from the accompanying drawings of various embodiments of the invention, which, however, should not be taken to limit the invention to the specific embodiments, but are for explanation and understanding only.

FIGS. 4A-F show exemplary embodiments of process flows according to the invention to form the vertical cell structure shown in FIG. 3A that eliminate or reduce sneak leakage path problems;

FIG. 6H shows an exemplary embodiment of process flows to form the vertical cell structure shown in FIG. 3E that eliminate or reduce sneak leakage path problems;

DETAILED DESCRIPTION

Figure 1A:
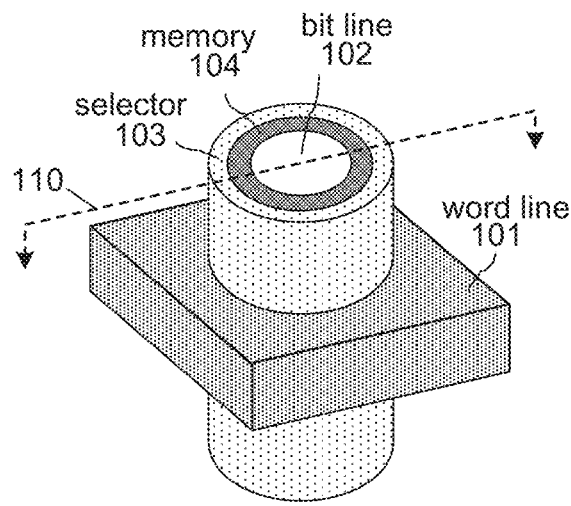
FIGS. 1A-B show a conventional vertical cell structure that experiences the sneak leakage path problem and a corresponding cross-sectional view.

Exemplary embodiments of the present invention are described herein in the context of a process, device, method, and apparatus for providing 3D vertical memory arrays that eliminate or reduce sneak leakage path problems.

Those of ordinary skilled in the art will realize that the following detailed description is illustrative only and is not intended to be in any way limiting. Other embodiments of the present invention will readily suggest themselves to skilled persons having the benefit of this disclosure. Reference will now be made in detail to implementations of the exemplary embodiments of the present invention as illustrated in the accompanying drawings. The same reference indicators or numbers will be used throughout the drawings and the following detailed description to refer to the same or like parts.

It should be noted that in the following descriptions, novel cell structures are disclosed that are suitable for use to form 3D vertical or horizontal bit line (BL) or word line (WL) arrays depending on the array orientation and/or perspective.

FIGS. 3A-F show exemplary embodiments of cell structures that eliminate or reduce sneak leakage path problems. In an exemplary embodiment, the structures shown in FIGS. 3A-H can be referred to as vertical bit line (BL) arrays and the structures shown in FIGS. 3I-N can be referred to as horizontal BL arrays, or depending on the perspective, a horizontal word line (WL) array.

FIG. 3A shows an exemplary embodiment of a novel vertical cell structure 300. The cell structure 300 comprises a horizontal electrode (word line) 301, a vertical electrode (bit line) 302, and a selector 303. The selector may be a P-N diode, Schottky diode, or any other material with threshold behavior for current flow direction. Also shown is a memory 304 that can be a resistive-switching material for RRAM, phase-change material such as chalcogenide for PCM, Ferromagnetic material for MRAM, ferroelectric material for FRAM, dielectric layer for antifuse OTP NVM, and/or any other material for any type of suitable memory. Both the selector 303 and memory 304 may be single layer or multiple layers. A cross-sectional indicator line 310 is also shown.

FIG. 3B shows a cross-sectional view of the cell structure 300 shown in FIG. 3A. For example, the cross-sectional view is taken at line 310. As illustrated in FIG. 3B, the cell structure 300 includes horizontal word lines 301a, 301b, and 301c having associated selector segments 303a, 303b, and 303c. As can be seen in FIG. 3B, the selector 303 is segmented with each segment associated with a particular word line. It will be assumed that a selected cell associated with word line 301b is an off-cell and that the associated memory element 305 has very high resistance. Because this cell's selector 303b is a segment and is not connected to selector segments of adjacent word lines, there is no sneak leakage path current flowing from the bit line 302 through the selectors of adjacent on-cells to the word line 301b of the off cell 305. Thus, the cell structure shown in FIG. 3A eliminates or reduces sneak leakage path problems.

FIGS. 3C-D show exemplary embodiments of a vertical cell structure 300A and its cross-sectional view. For example, a cross-sectional view of the cell structure 300A taken at line 310 is shown in FIG. 3D. The cell structure in FIG. 3C is similar to the cell structure in FIG. 3A except that the locations of the selector 303 and memory 304 are exchanged (or reversed). However, the configuration in FIG. 3C also prevents sneak path leakage problems since the cell structure's memory 304 is segmented and not connected to adjacent word lines. For example, if the memory 304b is an off-cell, then a region of high resistance 305 is formed that blocks sneak path leakage current from flowing from the bit line 302 through the selector 303 to word line 301b.

Figure 3E:
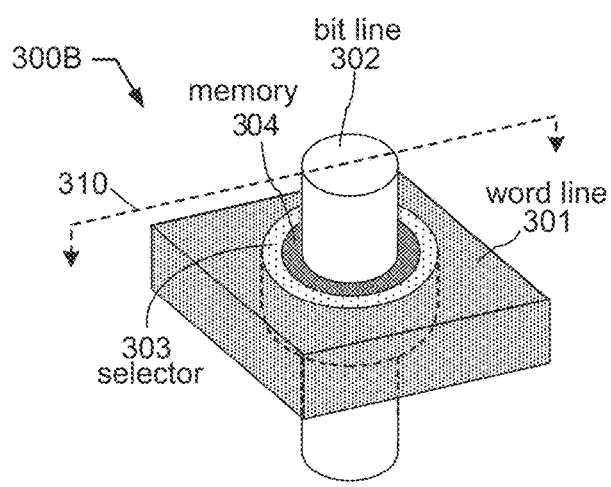
FIGS. 3A-N show exemplary embodiments of vertical cell structures that eliminate or reduce sneak leakage path problems.
Figure 3F:
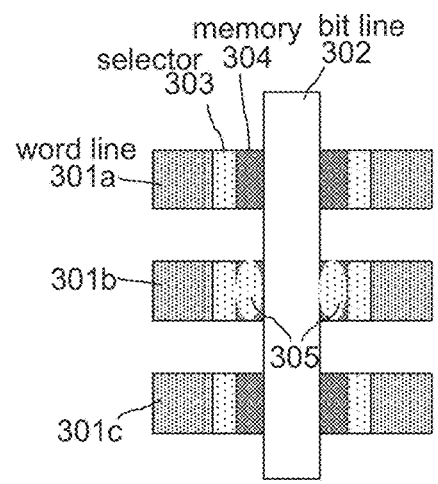

FIGS. 3E-F show exemplary embodiments of a vertical cell structure 300B and its cross-sectional view. For example, a cross-sectional view of the cell structure is taken at line 310 and is shown in FIG. 3F. In this cell structure, both the selector 303 and memory 304 are segmented and therefore separated from adjacent word lines. As a result, sneak path leakage problems are eliminated with this cell structure because there can be no current flow from the bit line 302 through the selector to the word line 301b of the off-cell.

Figure 3G:
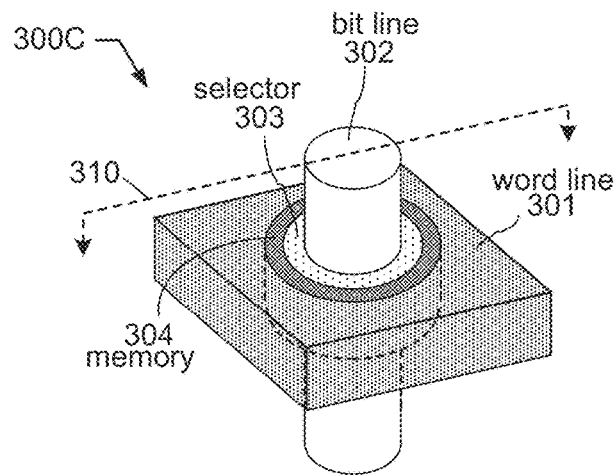
Figure 3H:
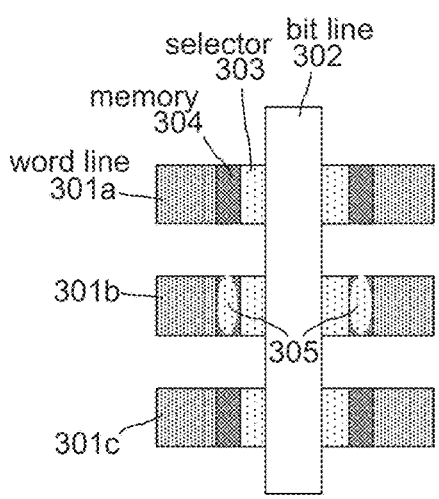

FIGS. 3G-H show exemplary embodiments of a vertical cell structure 300C and its cross-sectional view. For example, a cross-sectional view of the cell structure is taken at line 310 and is shown in FIG. 3H. This cell structure is similar to the one in FIG. 3E except that the locations of the selector 303 and memory 304 are exchanged (or reversed). Thus, both the selector 303 and memory 304 are segmented and therefore separated from adjacent word lines. As a result sneak path leakage problems are eliminated with this cell structure because there can be no current flow from the bit line 302 through the selector 303 to the word line 301b of the off-cell.

Figure 3I:
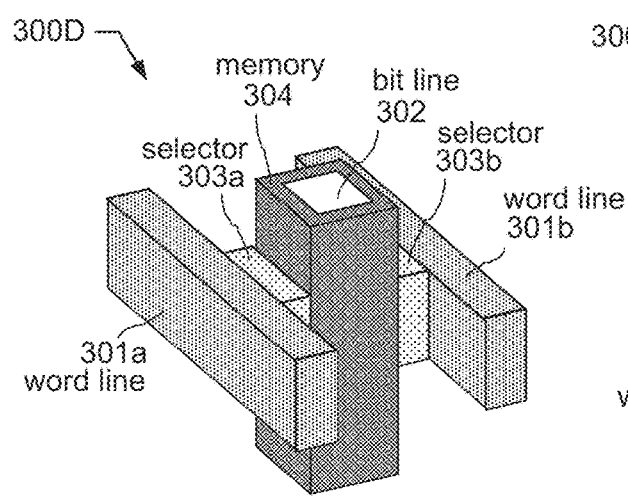

FIG. 3I shows an exemplary embodiment of a vertical cell structure 300D. This cell structure is similar to the cell structure shown in FIG. 3A except that the word line is separated into two portions (e.g., 301a and 301b) that connect to two sides of the bit line 302 to form two cells. Selectors 303a and 303b and memory layer 304 also are shown. As a result, sneak path leakage problems are eliminated with this cell structure because there can be no current flow from the bit line 302 through the segmented selectors 303a and 303b to the word lines 301a and 301b of the off-cells.

Figure 3J:
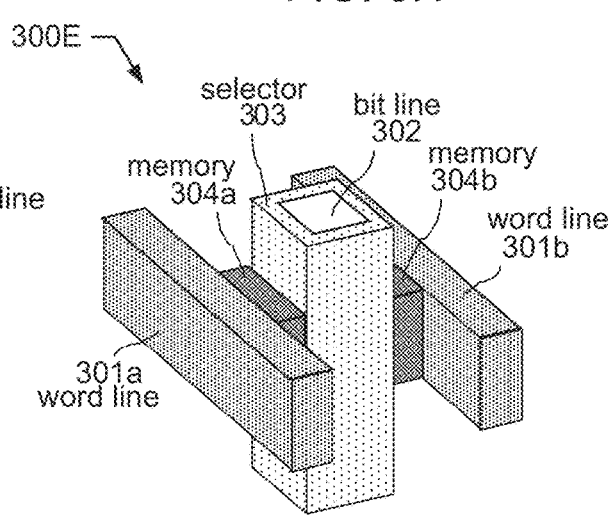

FIG. 3J shows an exemplary embodiment of a vertical cell structure 300E. This cell structure is similar to the one in FIG. 3I except the locations of the selector 303 and memory 304 are exchanged (or reversed). As a result, sneak path leakage problems are eliminated with this cell structure because there can be no current flow from the bit line 302 through the segmented memory 304a and 304b to the word lines 301a and 301b of the off-cells.

Figure 3K:
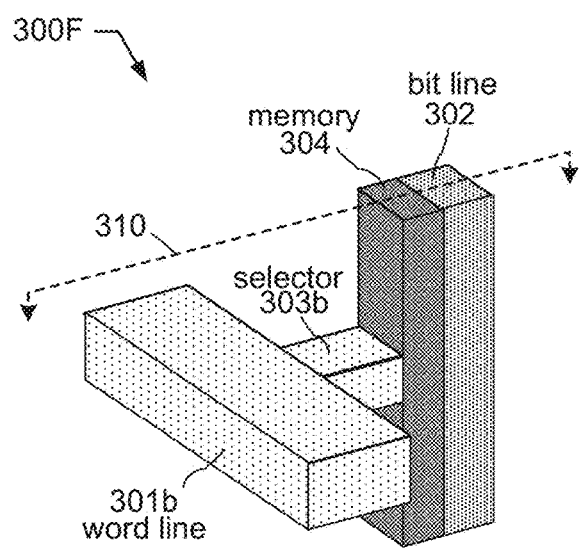
Figure 3L:
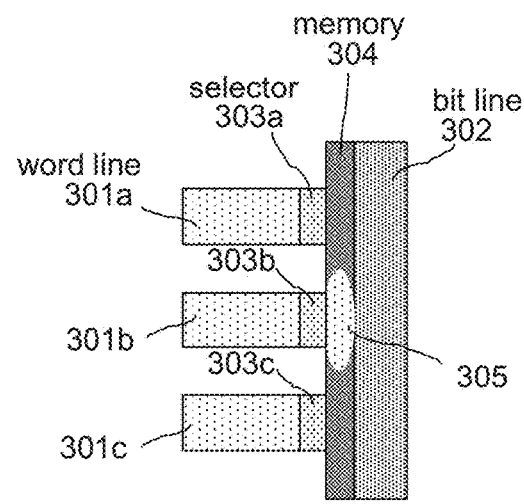

FIGS. 3K-L show exemplary embodiments of a vertical cell structure 300F and its cross-sectional view. For example, a cross-sectional view of the cell structure is taken at line 310 and shown in FIG. 3L. Also, note that for clarity, word lines 301a and 301c are added in FIG. 3L but are not shown in FIG. 3K. Similar to other cell structures above, sneak path leakage problems are eliminated with this cell structure because there can be no current flow from the bit line 302 through the segmented selector 303b to the word line 301b of the off-cell.

Figure 3M:
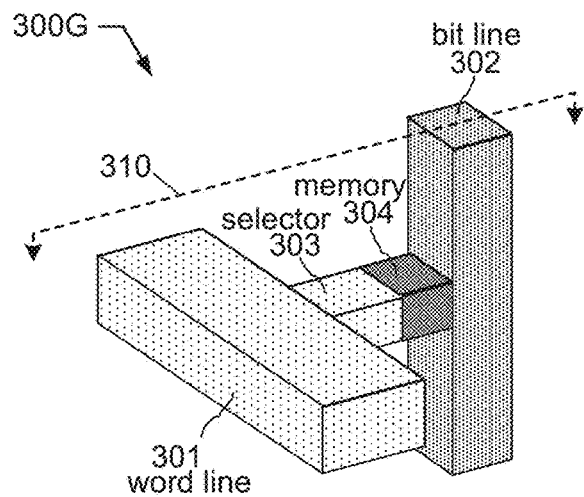
Figure 3N:
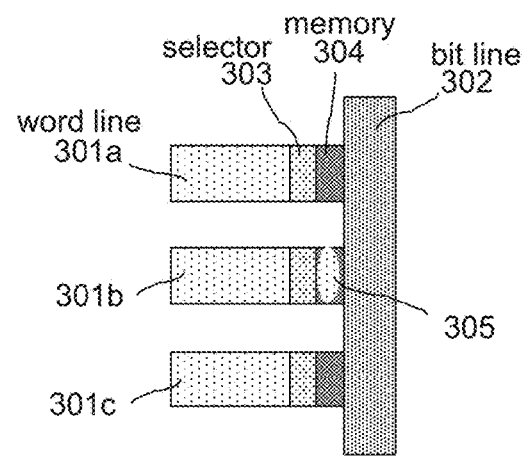

FIG. 3M-N show exemplary embodiments of a vertical cell structure 300G and its cross-sectional view. This cell is similar to the one in FIG. 3K except the memory 304 is segmented and therefore not connected to adjacent cells. FIG. 3N shows the cross-section view of the cell structure in FIG. 3M taken at line 310. Similar to the cell shown in FIG. 3K, the segmented selector and/or memory of the cell structure 300G prevents sneak leakage path problems. It should also be noted that in another embodiment, the select 303 and memory 304 may be exchanged (or reversed) for the cell structures shown in FIG. 3K and FIG. 3M and sneak leakage path problems would still be prevented.

Several exemplary novel process flows and/or steps to manufacture the above novel vertical cell structures are below disclosed.

Figure 1B:
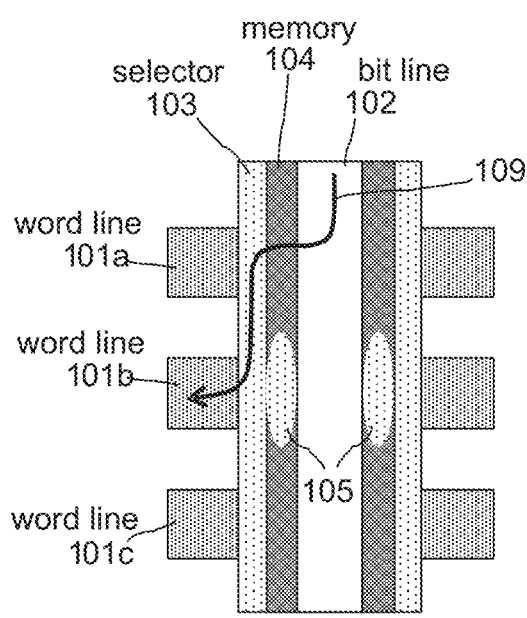
Figure 2A:
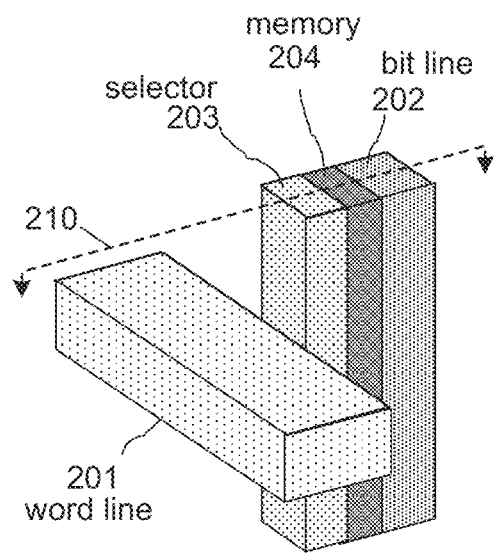
FIGS. 2A-B show another conventional vertical cell structure that experiences the sneak leakage path problem and a corresponding cross-sectional view.
Figure 2B:
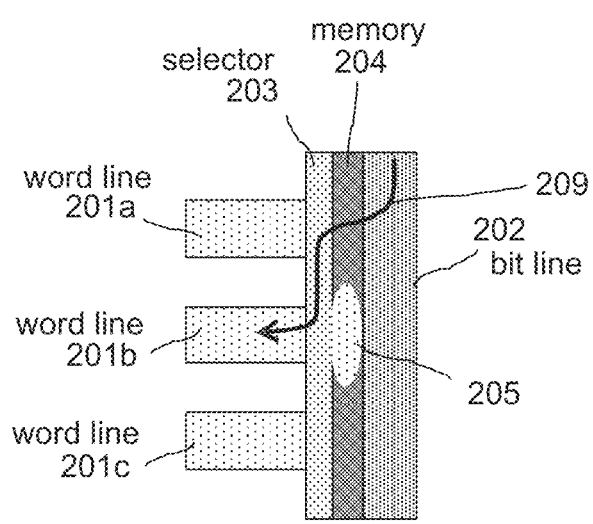

FIGS. 4A-F show exemplary embodiments of process flows according to the invention to form the vertical cell structure shown in FIG. 3A. FIG. 4A shows a first process step (or operation) wherein multiple conductor layers for word lines 401 and insulator layers 402 are deposited. FIG. 4B shows a second process step wherein bit line holes (or openings) 403 are pattern-etched through all the word line layers. FIG. 4C shows a third process step wherein word line material is selectively etched to form the spaces or regions 404 on the sidewall. FIG. 4D shows a fourth process step wherein the bit line holes 403 and regions 404 are filled with a selector material 407. FIG. 4D1 shows another exemplary embodiment in which the selector material 407 is formed as a layer on the sidewall of the bit line hole.

FIG. 4E shows a fifth process step wherein the selector material in the bit line holes is etched and the selector material 407 only partially remains in the sidewall region 404. FIG. 4F shows a sixth process step wherein a memory layer 405 is formed on the sidewall of the bit line holes, and then the bit line holes are filled with conductor 406 to form a bit line. As a result, the vertical cell structure shown in FIG. 3A is formed. Similarly, the vertical cell structure shown in FIG. 3C may be formed by using the same process flow with the selector layer 407 and memory layer 405 exchanged.

Figure 5A:
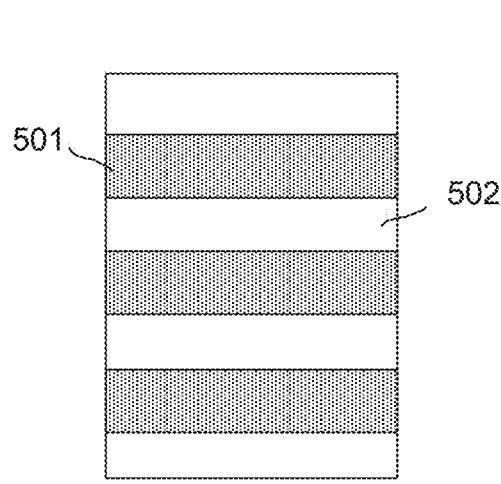
FIGS. 5A-H show exemplary embodiments of process flows to form the vertical cell structure shown in FIG. 3C that eliminate or reduce sneak leakage path problems.
Figure 5B:
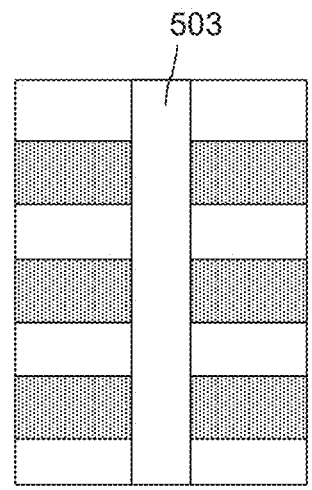
Figure 5C:
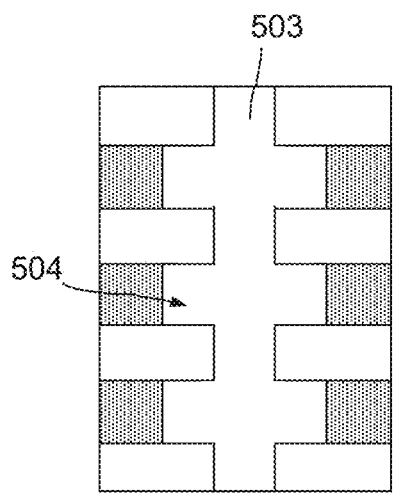
Figure 5D:
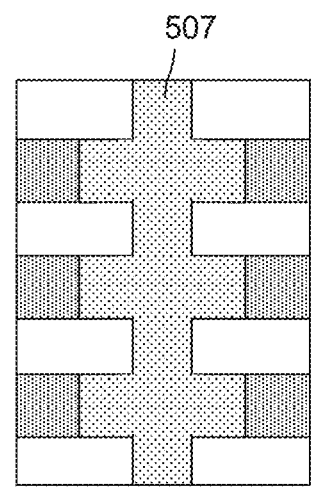

FIGS. 5A-H show exemplary embodiments of a process flow according to the invention to form the vertical cell structure in FIG. 3E. FIG. 5A shows a first process step (or operation) wherein multiple conductor layers for word lines 501 and insulator layers 502 are deposited. FIG. 5B shows a second process step wherein a bit line hole (or opening) 503 is pattern-etched through all the word line layers. FIG. 5C shows a third process step wherein the word line material is selectively etched to form the space (or regions) 504 on the sidewall. FIG. 5D shows a fourth process step wherein the bit line hole 503 and regions 504 are filled with the selector material 507. In another exemplary embodiment, the selector material 507 is formed as a layer on the sidewall of the bit line hole 503.

Figure 5E:
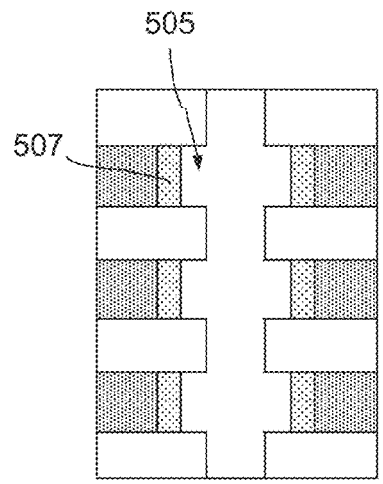
Figure 5F:
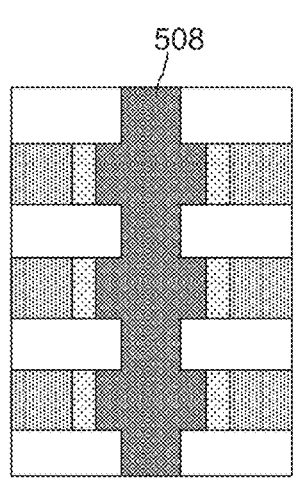

FIG. 5E shows a fifth process step wherein the selector material 507 in the bit line hole is selectively etched to partly remain in the region 504 and form a space (or region) 505 on the sidewall. FIG. 5F shows a sixth process step wherein the bit line hole 503 and regions 505 are filled with the memory layer material 508. In another exemplary embodiment, shown in FIG. 5F1, the memory material 508 is formed as a layer on the sidewall of the bit line hole 503.

Figure 5G:
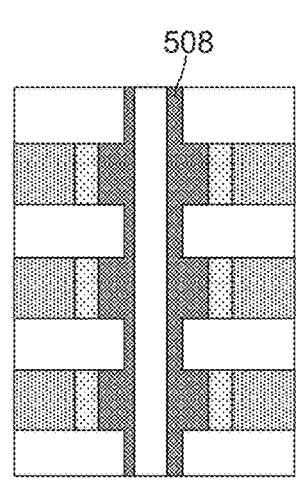
Figure 5G:
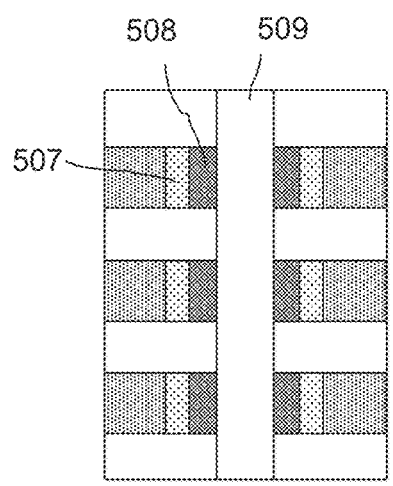
Figure 5H:
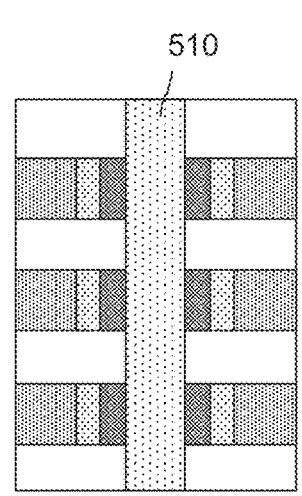

FIG. 5G shows a seventh process step wherein the memory layer material 508 in the bit line hole is selectively etched forming a hole or opening 509 and leaving a portion of memory layer material 508 on the sidewall that fills the opening 505. FIG. 5H shows an eighth process step wherein the bit line hole 509 is filled with conductor 510 to form the bit line. As a result, the cell structure shown in FIG. 3E is formed. Similarly, the cell structure embodiment shown in FIG. 3G may be formed by using the same process flow with the selector layer 507 and memory layer 508 exchanged.

Figure 6A:
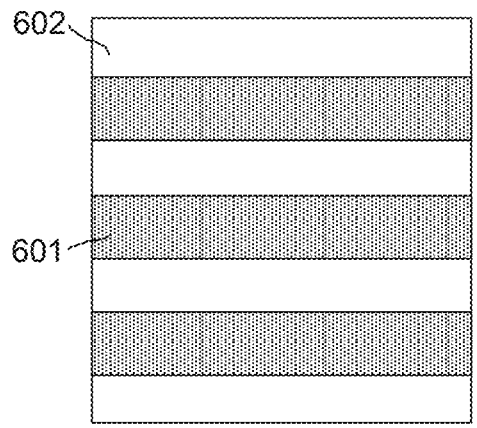
FIGS. 6A-H show exemplary embodiments of process flows to form the vertical cell structure shown in FIG. 3A that eliminate or reduce sneak leakage path problems.
Figure 6B:
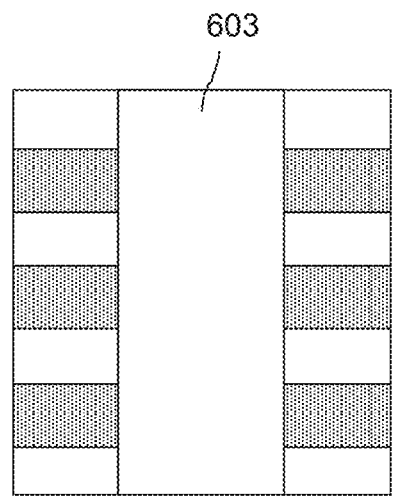
Figure 6C:
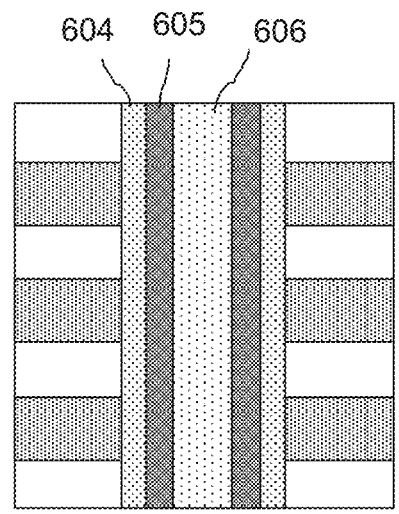
Figure 6D:
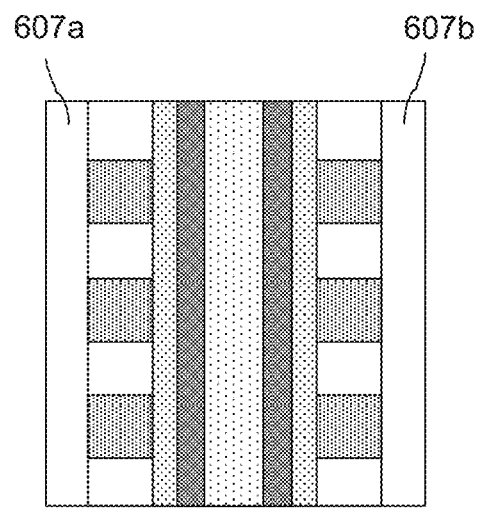
Figure 6E:
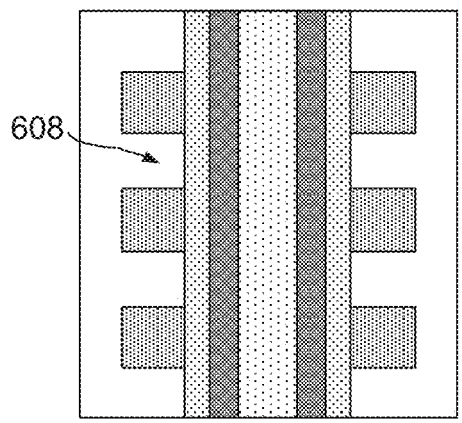
Figure 6F:
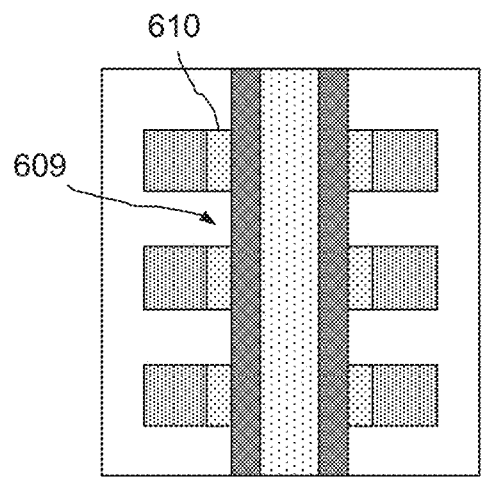
Figure 6G:
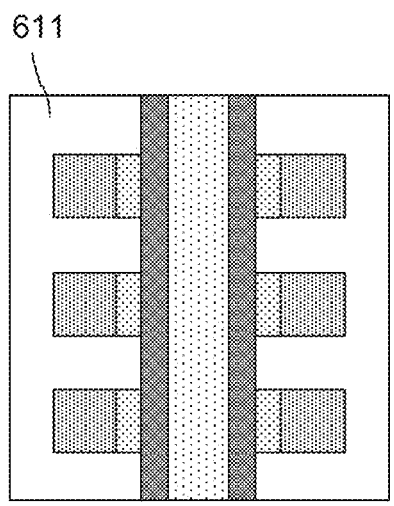

FIGS. 6A-G show exemplary embodiments of process flows to form the cell structure shown in FIG. 3A that eliminates sneak leakage path problems. This flow is suitable for use with a 3D array having word line slits. FIG. 6A shows a first process step (or operation) wherein multiple conductor layers for word lines 601 and insulator layers 602 are deposited. FIG. 6B shows a second process step wherein a bit line hole 603 is pattern-etched through all the word line layers. FIG. 6C shows a third process step wherein a selector layer 604 and memory layer 605 are formed on the sidewall of the bit line hole 603. The remaining portion of the bit line hole 603 is filled with conductor 606. FIG. 6D shows a fourth process step wherein word line slits 607a and 607b are pattern-etched through all the word line layers. FIG. 6E shows a fifth process step wherein the insulator layers between the word line layers in the area or region 608 are selectively etched away through the word line slits. FIG. 6F shows a sixth process step wherein the selector layer 604 in the area or region 609 between the word lines is selectively etched away through the word line slits to form the separated selectors 610 for each cell (e.g., word line). FIG. 6G shows a seventh process step wherein the word line slits and the space between the word line layers are filled with insulator 611. As a result, the cell structure shown in FIG. 3A is formed.

Figure 6H:
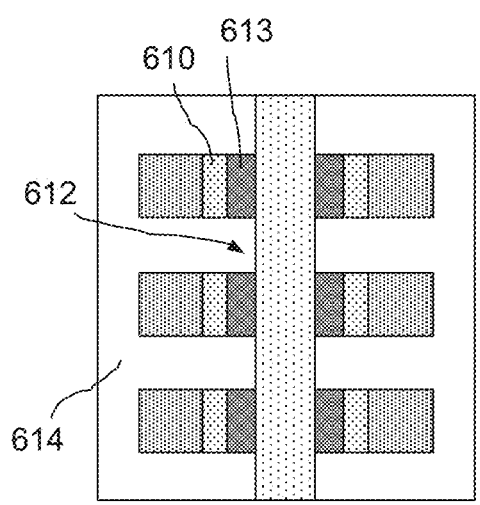

FIG. 6H shows an exemplary embodiment of process flows to form the cell structure shown in FIG. 3E that eliminates sneak leakage path problems. After the process operations of FIG. 6F are performed, the memory layer in the area 612 is selectively etched away through the word line slits to form separate memory element 613 for each cell. Then, the word line slits and the space between the word line layers are filled with insulator 614. As a result, the cell structure shown in FIG. 3E is formed. Similarly, the cell embodiments of FIG. 3C can be formed using the same process flow used to form the cell structure shown in FIG. 3A, and the cell embodiment shown in FIG. 3G can be formed using the same process flow used to form the cell structure shown in FIG. 3E by simply exchanging the selector layer 610 and memory layer 613.

Figure 7A:
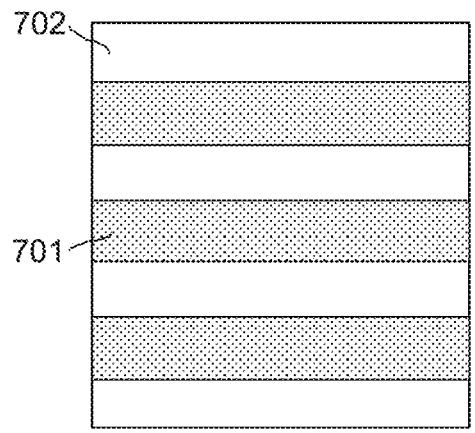
FIGS. 7A-H show exemplary embodiments of process flows suitable for use with a 3D array having word line slits to form the vertical cell structures that eliminate or reduce sneak leakage path problems.
Figure 7B:
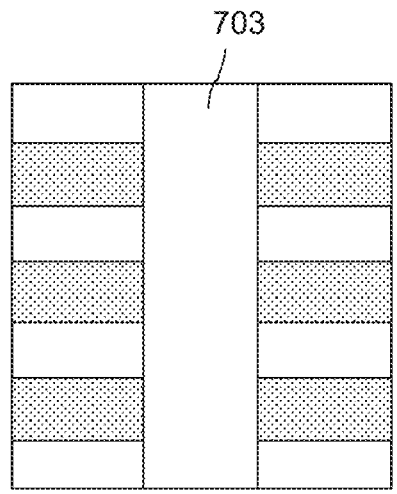
Figure 7C:
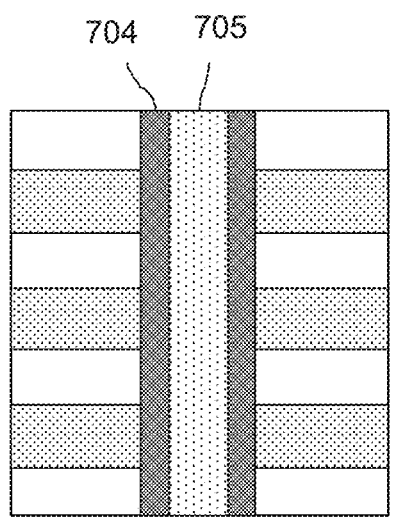
Figure 7D:
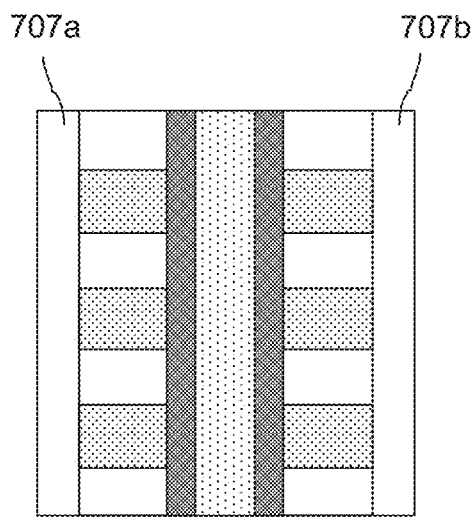

FIGS. 7A-H show exemplary embodiments of process flows suitable for use with a 3D array having word line slits to form vertical cell structures that eliminates sneak leakage path problems. FIG. 7A shows a first process step (or operation) wherein multiple selector layers 701 and insulator layers 702 are deposited. FIG. 7B shows a second process step wherein a bit line hole (or opening) 703 is pattern-etched through all the selector layers 701 and insulator layers 702. FIG. 7C shows a third process step wherein a memory layer 704 is formed on the sidewall of the bit line hole. Then, the remaining portion of the bit line hole is filled with conductor 705. FIG. 7D shows a fourth process step wherein slits 707a and 707b are pattern-etched through all the selector layers.

Figure 7E:
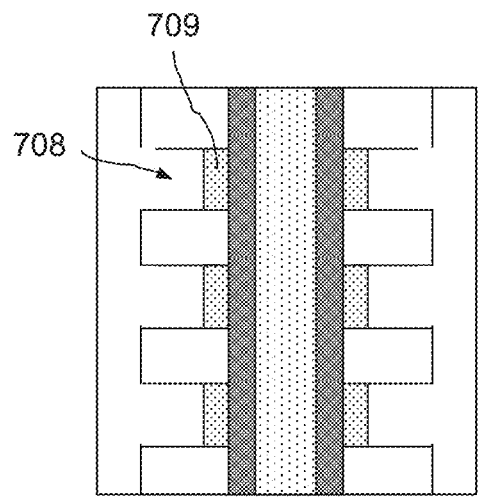
Figure 7F:
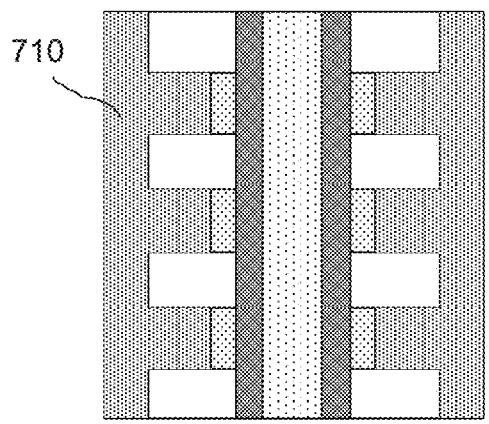
Figure 7G:
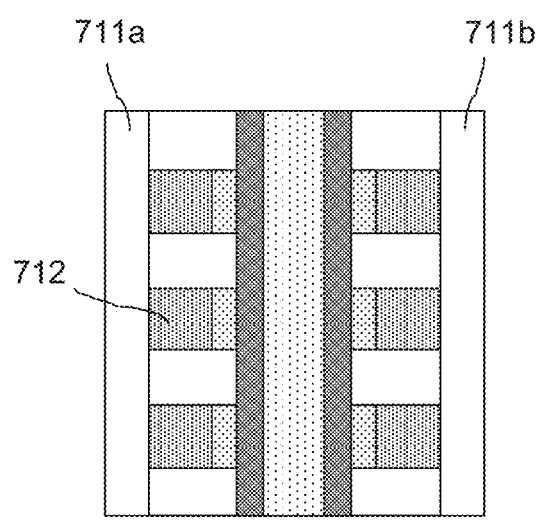
Figure 7H:
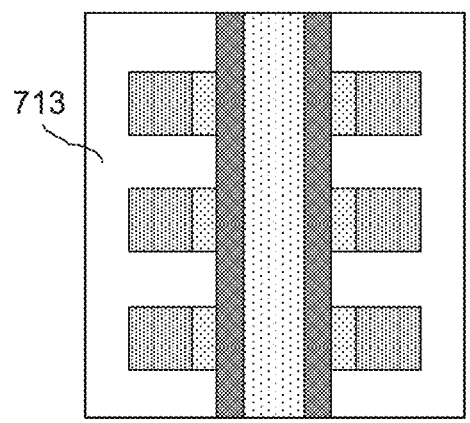

FIG. 7E shows a fifth process step wherein the selector layers in the area 708 are selectively etched through the slits to form a separated selector 709 for each cell. FIG. 7F shows a sixth process step wherein the slits and the space between the insulator layers are filled with conductor 710. FIG. 7G shows a seventh process step wherein the conductor material 710 located in slits 711a and 711b are etched away to form the word line pattern 712. FIG. 7H shows an eighth process step wherein the slits are filled with insulator 713. As a result, the cell structure shown in FIG. 3A is formed. Similarly, the cell structure embodiment of FIG. 3E may be formed by using a similar process flow but skipping the process shown in FIG. 7C and repeating the process shown in FIG. 7E for the memory layer.

Please notice, the cell embodiments shown in FIG. 3I-J may be formed by the same process flows previously described, except an extra etching step may be applied before the bit line hole etching to separate the word lines. After which, the word line slits are filled with insulator, and then the bit line holes are etched.

Figure 8A:
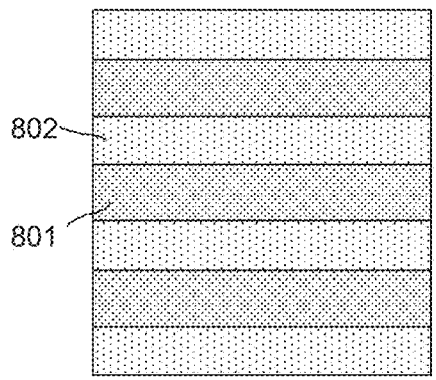
FIGS. 8A-F shows exemplary embodiments of process flows to form the vertical cell structure shown in FIG. 3K that eliminate or reduce sneak leakage path problems.
Figure 8B:
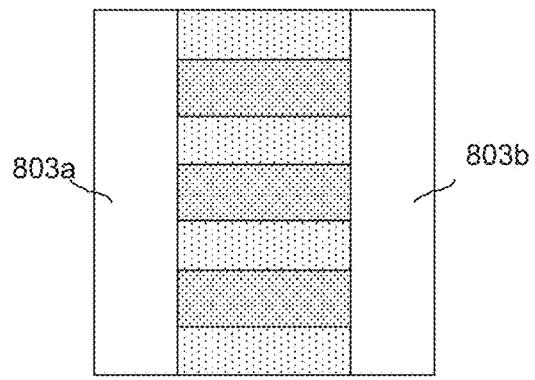
Figure 8C:
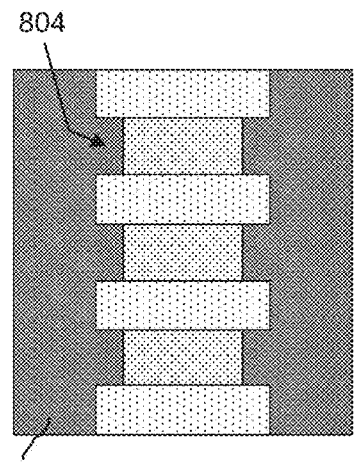
Figure 8D:
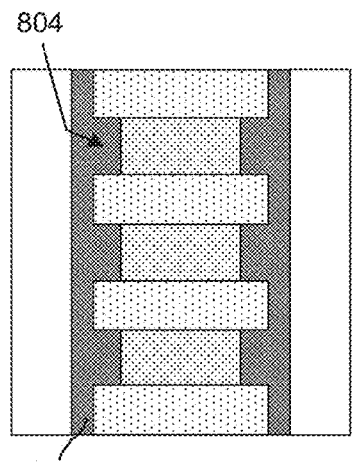
Figure 8D:
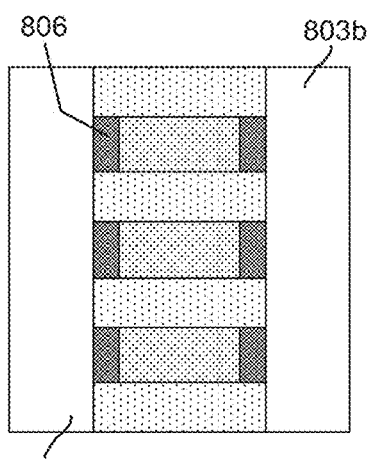
Figure 8E:
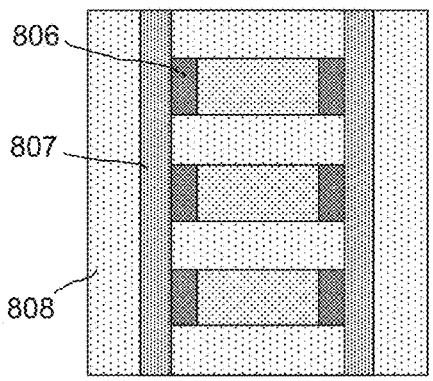
Figure 8F:
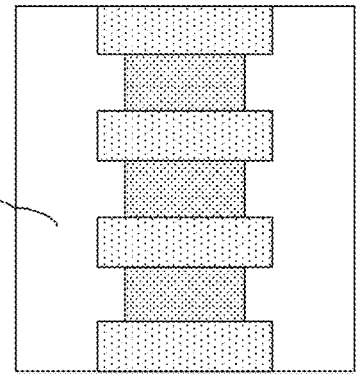

FIGS. 8A-F shows exemplary embodiments of process flows to form the vertical cell structure shown in FIG. 3K that eliminates sneak leakage path problems. FIG. 8A shows a first process step (or operation) wherein multiple conductor layers for word lines 801 and insulator layers 802 are deposited. FIG. 8B shows a second process step wherein word line slits 803a and 803b are etched though all word line layers to form the word line pattern. FIG. 8C shows a third process operation wherein the word line material is selectively etched to form the space 804 on the sidewall of the slits. Then, the slits are filled with a selector material 805. In another exemplary embodiment, shown in FIG. 8C1, the selector material 805 is formed on the sidewall of the slits. FIG. 8D shows a fourth process step wherein the selector material in slits 803*a* and 803*b* are etched to form the separated selectors 806 for each cell. FIG. 8E shows a fifth process step wherein a memory layer 807 is formed on the sidewall of the word line slits. Then, the word line slits are filled with conductor 808. After that, the bit line pattern is defined and self-align-etched to etch away the unwanted area's conductor 808, memory layer 807, and selector layer 806. FIG. 8F shows a sixth process step wherein the unwanted area after the bit line pattern etching is filled with insulator 809. As a result, the cell structure shown in FIG. 3K is formed. Similarly, another cell embodiment may be formed by using the same process flow with the selector and memory layers exchanged.

Figure 8G:
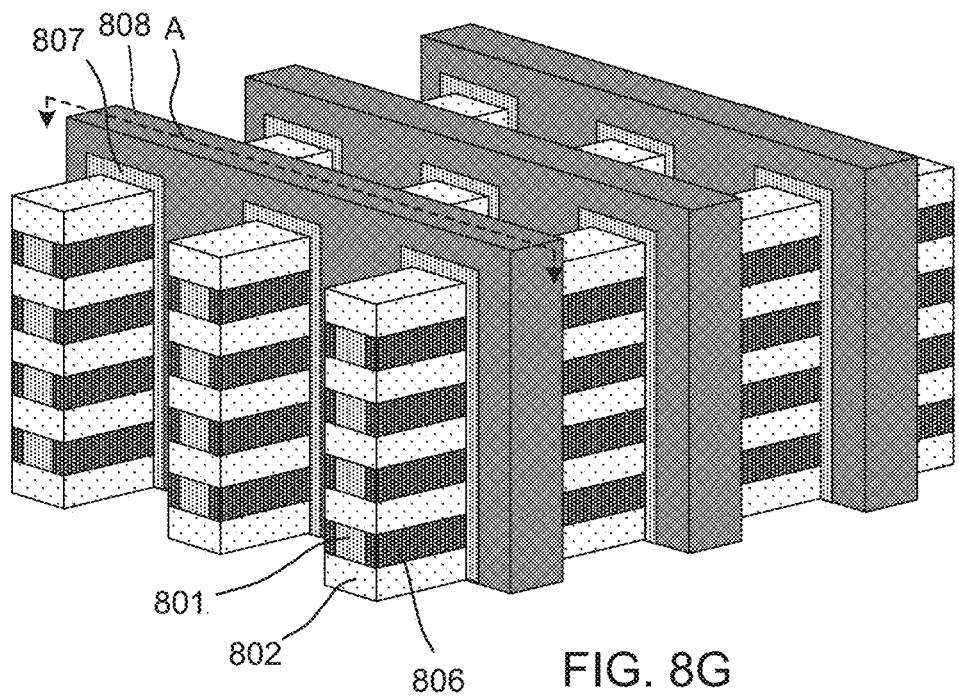
FIGS. 8G-H shows exemplary embodiments of 3D vertical arrays formed by the vertical cell structures shown in FIGS. 8A-F that eliminate or reduce sneak leakage path problems.
Figure 8H:
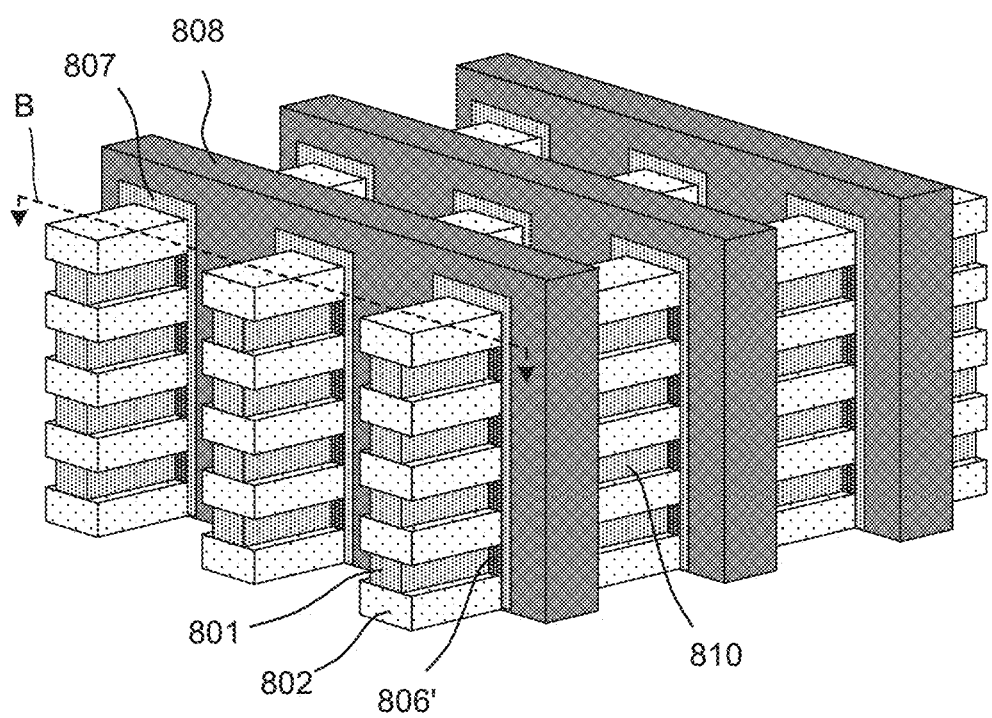

FIGS. 8G-H shows exemplary embodiments of 3D arrays formed using the vertical cell structures shown in FIGS. 8A-F. For example, the 3D arrays can be 3D horizontal bit line arrays or 3D horizontal word line arrays depending on the array orientation. For example, FIG. 8G shows a 3D horizontal bit line array before removal of the selector sidewall as illustrated in FIG. 8E. FIG. 8H shows the 3D horizontal bit line array after removal of the selector sidewall as illustrated in FIG. 8F. Thus, FIG. 8E shows the cross-section view along line A of the array shown in FIG. 8G, and FIG. 8F shows the cross-section view along line B of the array shown in FIG. 8H.

Figure 9A:
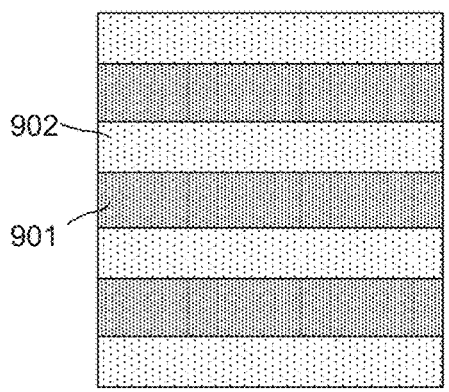
FIGS. 9A-H show exemplary embodiments of process flows to form the vertical cell structure shown in FIG. 3M that eliminate or reduce sneak leakage path problems.
Figure 9B:
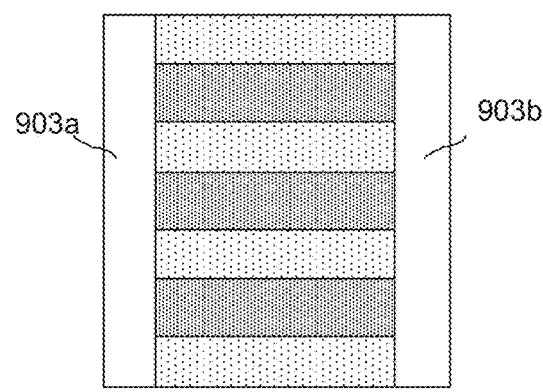
Figure 9C:
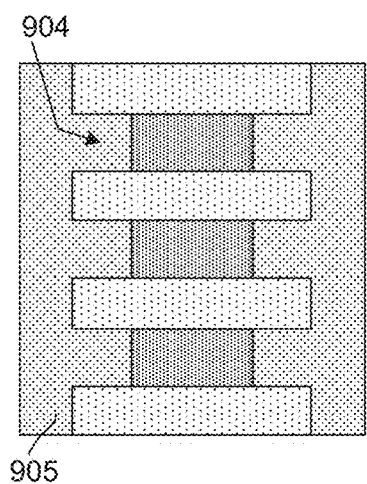
Figure 9D:
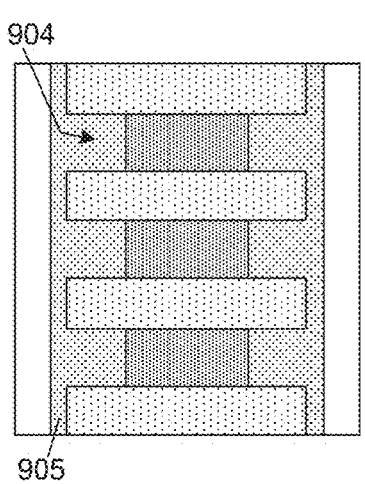
Figure 9D:
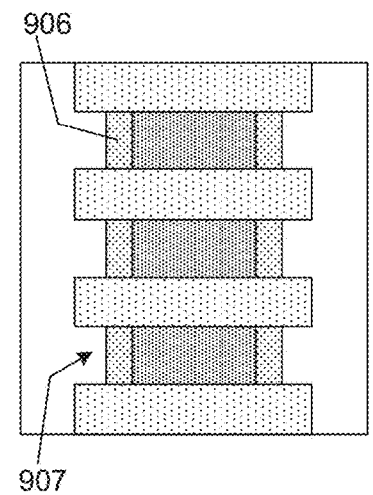

In FIG. 8G, the word line pattern 808 and the memory layer 807 are defined and etched. The selector layers, such as 806, remained in the sidewall of the bit lines 801. In FIG. 8H, the selector layer 806 in the area such as 810 that is not covered by the word line pattern 808 is etched. Therefore, only the selector layer (e.g., 806') that is covered by the word line pattern 808 remains. As a result, a discrete selector is formed for each cell in the intersection of a word line and a bit line FIGS. 9A-H show exemplary embodiments of process flows to form the cell structure shown in FIG. 3M that eliminates sneak leakage path problems. FIG. 9A shows a first process step (or operation) wherein multiple conductor layers for word lines 901 and insulator layers 902 are deposited. FIG. 9B shows a second process step wherein word line slits 903*a* and 903*b* are etched though all word line layers to form the word line pattern. FIG. 9C shows a third process step wherein the word line material is selectively etched to form the space 904 on the sidewall of the slits. Then, the slits are filled with a selector material 905. In another exemplary embodiment, shown in FIG. 9C1, the selector material 905 is formed on the sidewall of the slits. FIG. 9D shows a fourth process step wherein the selector material is selectively etched to form the separated selectors 906 for each cell and the space 907 on the sidewall of the slits.

Figure 9E:
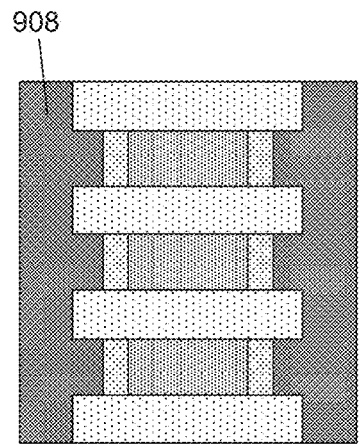
Figure 9F:
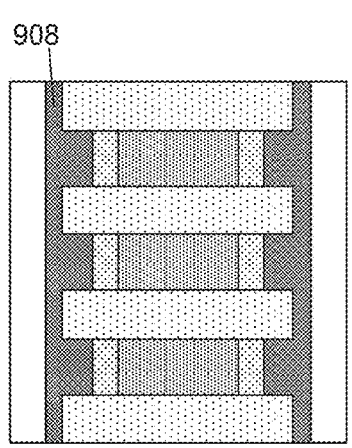
Figure 9F:
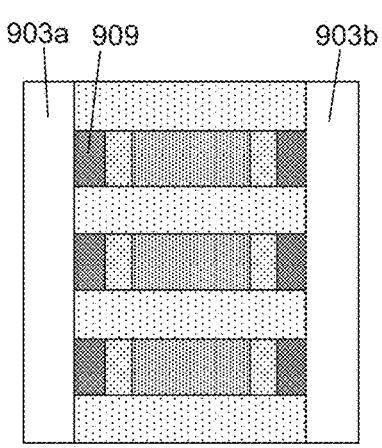
Figure 9G:
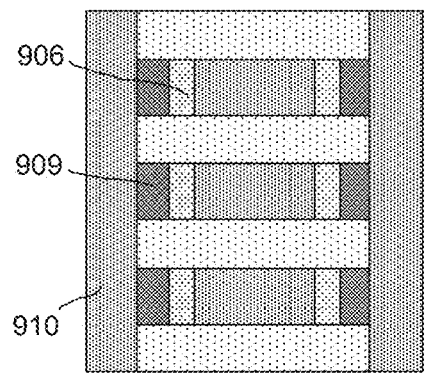
Figure 9H:
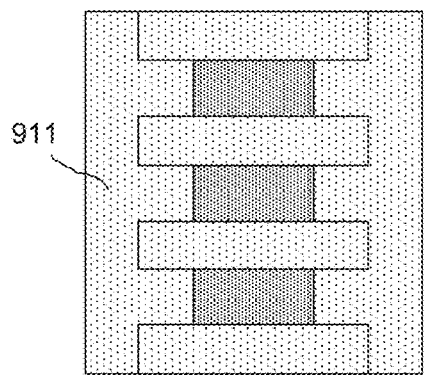

FIG. 9E shows a fifth process step wherein the slits are filled with a memory layer material 908. In another exemplary embodiment, shown in FIG. 9E1, the selector material 908 is formed on the sidewall of the slits. FIG. 9F shows a sixth process step wherein the memory layer in the slits 903*a* and 903*b* is etched to form the separated memory layer 909 for each cell. FIG. 9G shows a seventh process step wherein the slits are filled with conductor 910. After that, the bit line pattern is defined and self-align-etched to etch away the unwanted area's conductor 910, memory layer 909, and selector layer 906. FIG. 9H shows an eighth process step wherein the unwanted area after the bit line pattern etching is filled with insulator 911. As a result, the cell structure shown in FIG. 3M is formed. Similarly, another cell embodiment may be formed by using the same process flow with the selector and memory layers exchanged.

Figure 10:
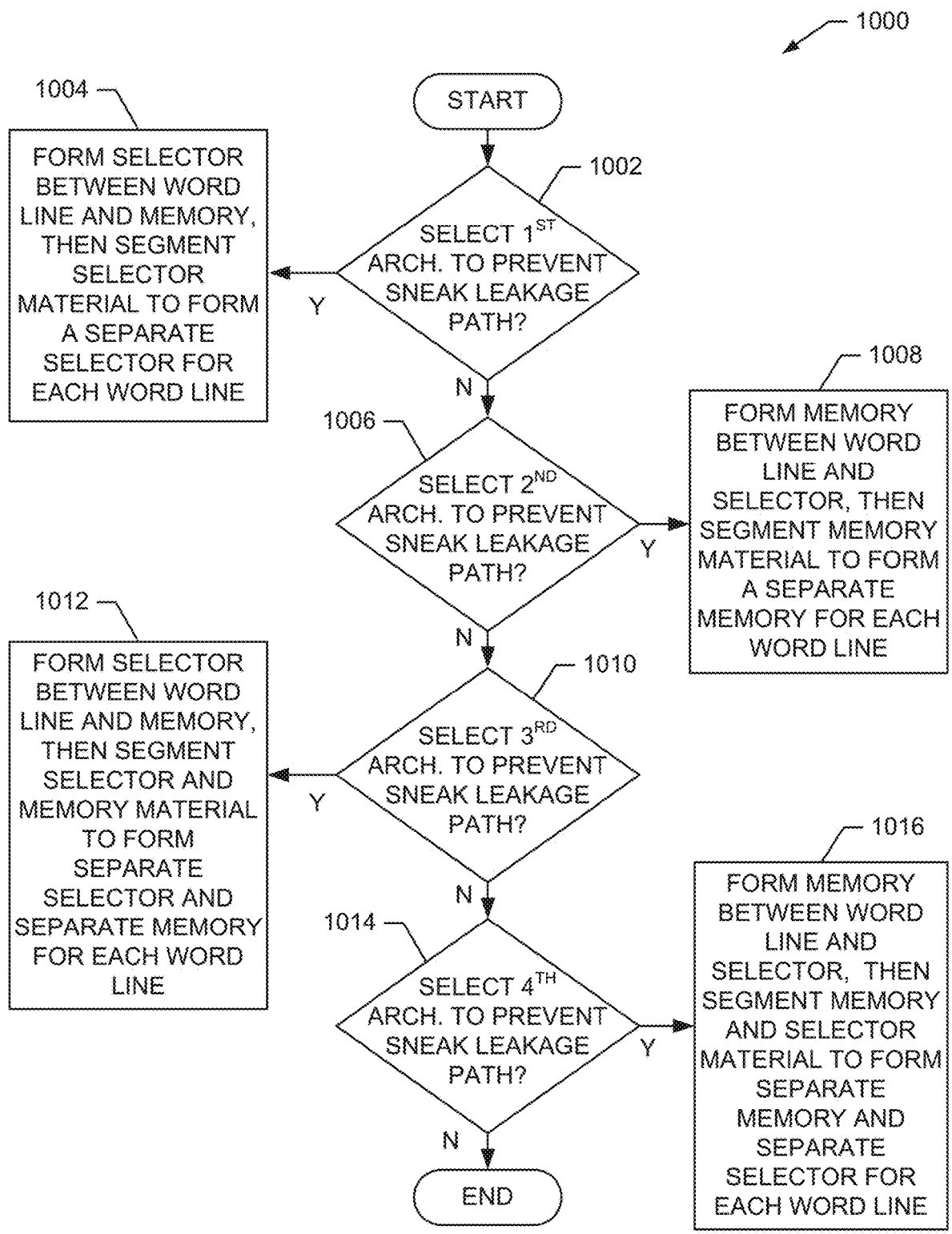
FIG. 10 shows an exemplary embodiment of method for forming a novel cell structure that eliminates or reduces sneak leakage path problems for use in a vertical 3D array.

FIG. 10 shows an exemplary embodiment of method 1000 to form a novel cell structure that eliminates or reduces sneak leakage path problems for use in a vertical 3D array. In an exemplary embodiment, the method 1000 is suitable for use to form the novel cell structures above described.

At block 1002, a determination is made as to whether a first architecture for the vertical cell structure will be used to form the vertical array to prevent sneak leakage path problems. If the first architecture is to be used, then the method proceeds to block 1004. If the first architecture will not be used, then the method proceeds to block 1006.

At block 1004, the 3D vertical array is formed using a vertical cell structure based on the first architecture wherein a selector is formed between the word lines and the memory. The selector is then segmented to form a separate selector segment for each word line. For example, the first architecture results in a vertical cell structure as shown in FIG. 3B.

At block 1006, a determination is made as to whether a second architecture for the cell structure will be used to form the vertical array to prevent sneak leakage path problems. If the second architecture is to be used, then the method proceeds to block 1008. If the second architecture will not be used, then the method proceeds to block 1010.

At block 1008, the 3D vertical array is formed using a vertical cell structure based on the second architecture wherein a memory is formed between the word lines and the selector. The memory is then segmented to form a separate memory segment for each word line. For example, the second architecture results in a cell structure as shown in FIG. 3D.

At block 1010, a determination is made as to whether a third architecture for the cell structure will be used to form the vertical array to prevent sneak leakage path problems. If the third architecture is to be used, then the method proceeds to block 1012. If the third architecture will not be used, then the method proceeds to block 1014.

At block 1012, the 3D vertical array is formed using cell structure based on the third architecture wherein a selector is formed between the word lines and the memory. The selector and the memory are then segmented to from a separate selector segment and a separate memory segment for each word line. For example, the third architecture results in a cell structure as shown in FIG. 3F.

At block 1014, a determination is made as to whether a fourth architecture for the cell structure will be used to form the vertical array to prevent sneak leakage path problems. If the fourth architecture is to be used, then the method proceeds to block 1016. If the fourth architecture will not be used, then the method ends.

At block 1016, the 3D vertical array is formed using cell structure based on the fourth architecture wherein a memory is formed between the word line and the selector. The memory and the selector are then segmented to form a separate memory segment and a separate selector segment for each word line. For example, the fourth architecture results in a cell structure as shown in FIG. 3H.

Thus, the method 1000 operates to form a novel cell structure that eliminates or reduces sneak leakage path problems for use in a vertical 3D array. It should be noted that the method 1000 is exemplary and that the disclosed operations may be combined, rearranged, added to, deleted, and/or modified within the scope of the embodiments.

ALTERNATIVE EMBODIMENTS

The following exemplary embodiments disclose novel 3D array structures and processes for resistive type or phase-change type of devices. The disclosed 3D array structures can be formed using simpler process steps than conventional arrays, and therefore reduce manufacturing costs and increase yield. Moreover, the disclosed 3D structures are very compact and suitable for high-density applications. For example, the 3D structures can be used in non-volatile memories, neural networks, or other applications requiring high density.

FIGS. 11A-F show novel 3D array structures and associated process steps.

Figure 11A:
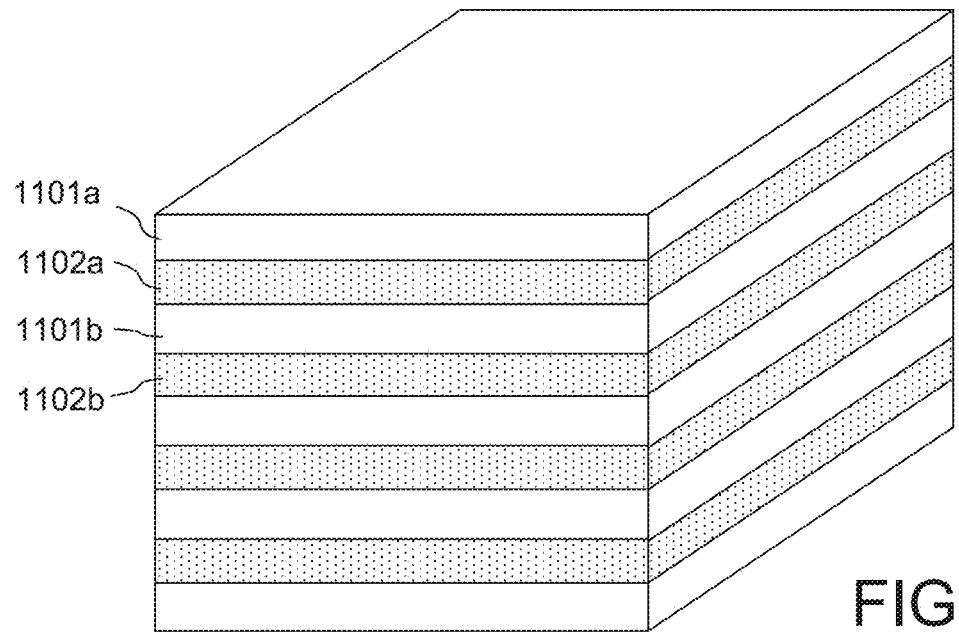
FIGS. 11A-F shows novel 3D array structures and associated process steps.

FIG. 11A shows an exemplary embodiment of a 3D array structure. In this structure, multiple insulator layers, such as 1101*a* and 1101*b*, and multiple conductor layers, such as 1102*a* and 1102*b*, are deposited to form a stack. The insulator layers may be oxide or other suitable materials. The conductor layers may be metal, polysilicon, or other suitable materials.

Figure 11B:
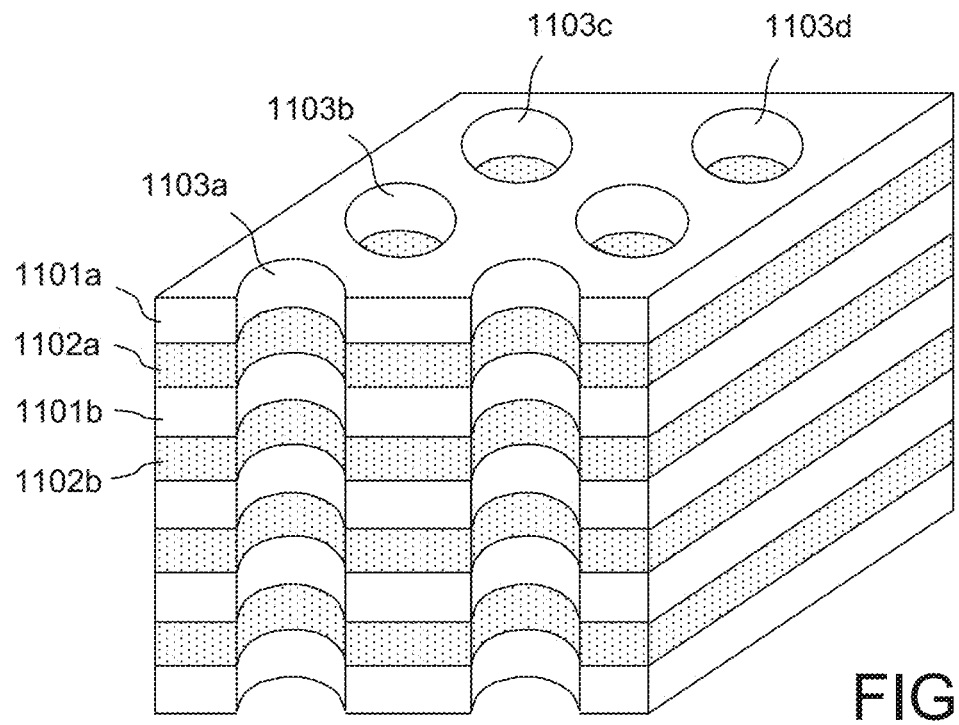

FIG. 11B illustrates how the stack shown in FIG. 11A is etched to produce multiple vertical holes (or openings), such as holes 1103*a-d*. The etched holes may be any shape, such as circular or rectangular.

Figure 11C:
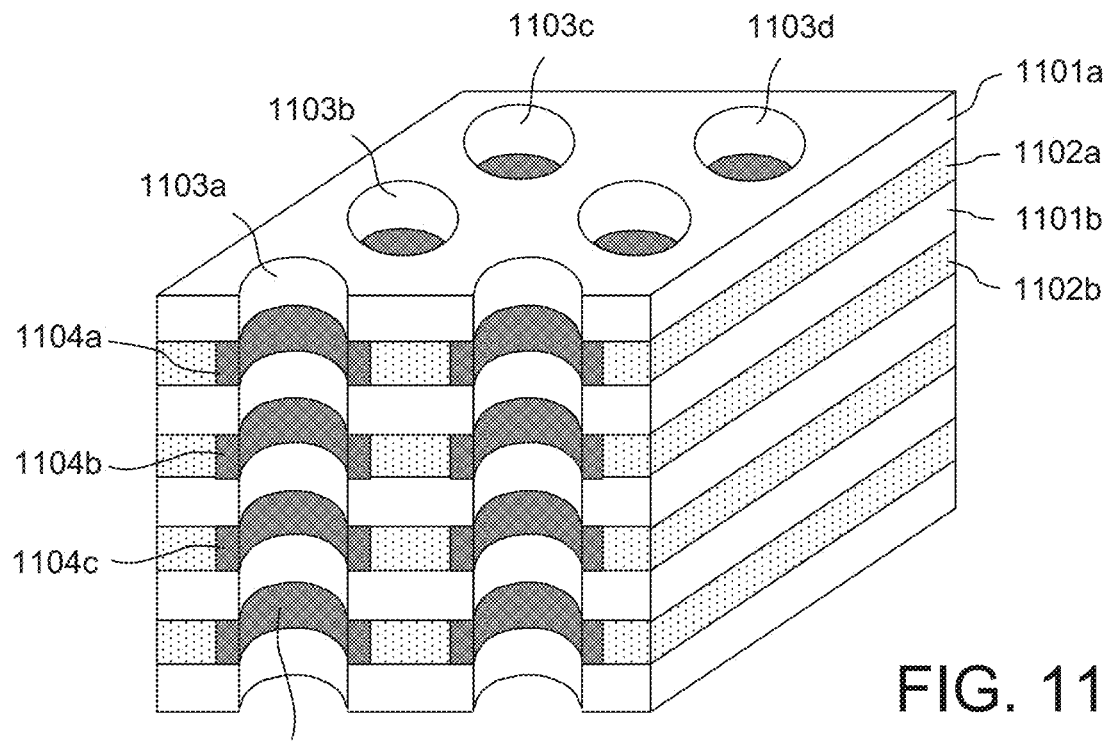

FIG. 11C illustrates the stack shown in FIG. 11B and includes selector devices, such as 1104*a-c* that are formed on the exposed sidewalls of the holes 1103*a-d* in locations where the conductor layers, such as 1102*a-b*, are exposed. As illustrated in FIG. 11C, the selector devices are not formed on the sidewalls of the insulator layers 1101. By forming the selector devices on the exposed sidewalls of the conductor layers 1102, the selector devices become donut-shape islands around the holes or openings. Each selector device allows one conductor layer, such as conductor layer 1102*a*, to be selectively coupled to conductive material that may fill the vertical holes in a later operation. Without the selector devices, current may leak between conductor layers by flowing through the conductive material filled in the vertical holes.

In one embodiment, the conductor layers 1102 are formed by a selected metal, such as Tantalum (Ta), Niobium (Nb), Titanium (Ti), Zirconium (Zr), Vanadium-Chromium (VCr), or other suitable metal. In an exemplary embodiment, based on the metal of the conductor layers, the selector devices 1104 are formed by using metal-oxidation through the holes 1103 to form TaOx, NbOx, TiOx, ZrOx, or VCrOx layers on the sidewalls within the holes of the metal layers 1102. These metal-oxide layers perform with threshold behavior like Schottky diodes.

Figure 11D:
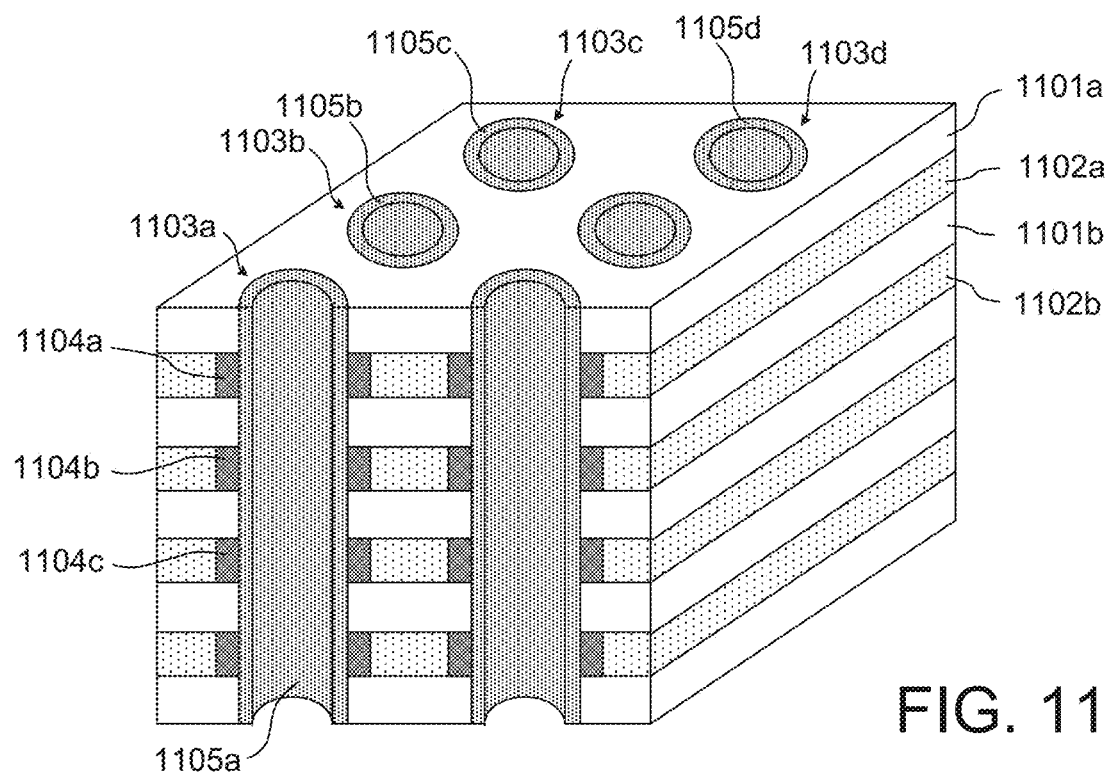

FIG. 11D illustrates the stack shown in FIG. 11C and includes resistive layers, such as 1105*a-d*, that are formed by using thin film deposition on the sidewall of the holes 1103. For example, the resistive layer is deposited within the holes over the sidewalls of the insulator layers 1101 and the selector devices 1104. In one embodiment, the resistive layers may comprise at least one of HfOx, LiSiOx, ZrSiOx, WOx, TaOx, NbOx, TiOx, AlOx, NiOx, ZrOx, CuOx, CrOx, MnOx, MoOx, SiOx, and other suitable materials. When applying the appropriate voltages and current to the resistive layers 1105, the resistance of the resistor layers 1105 may be changed to represent stored values. The resistive layers do not fill the holes 1103 completely. Once the resistive layer is deposited on the sidewall of the holes 1103, a smaller hole remains that passes through the array stack.

Figure 11E:
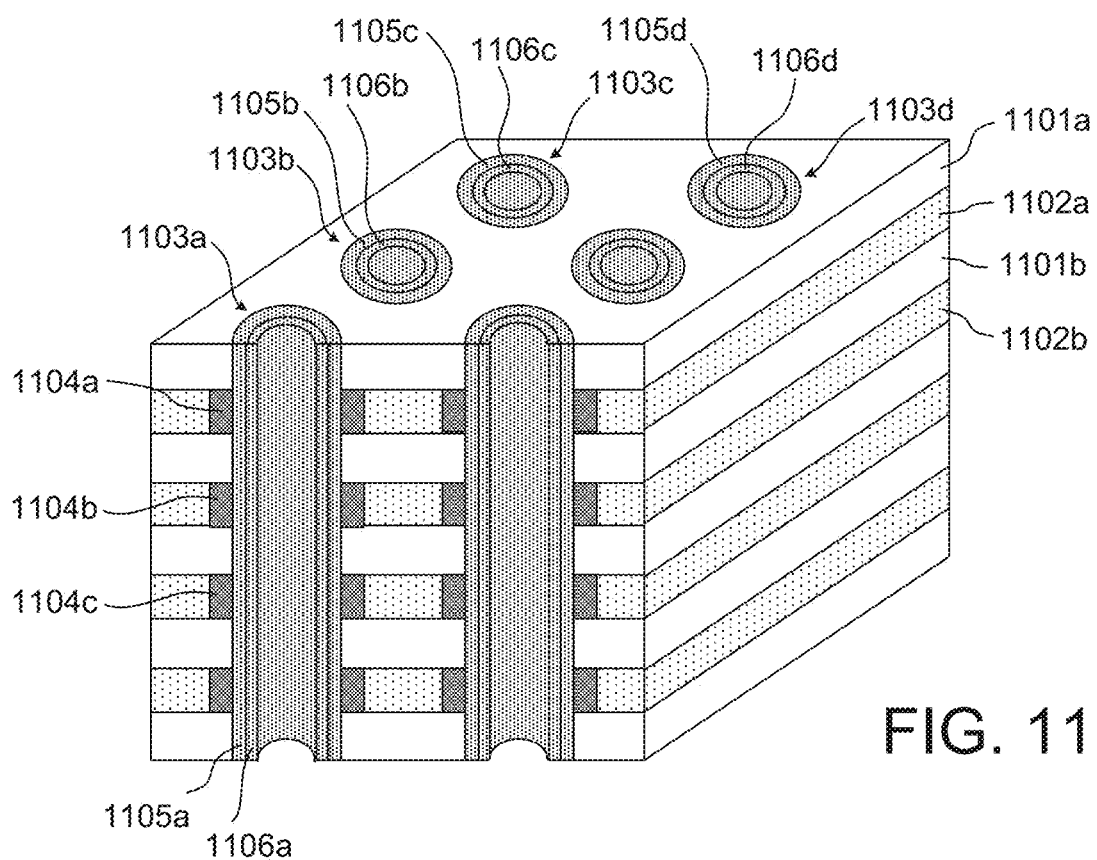

FIG. 11E illustrates the stack shown in FIG. 11D and further illustrates another embodiment in which the resistive layers 1105 comprise multiple layers. For example, in one embodiment, the resistive layers comprise a first layer 1105 that is formed from HfOx and a second layer 1106 that is formed from AlOx or PtOx.

In another embodiment, the first layer 1105 comprises phase-change material, such as chalcogenide, and the second layer 1106 comprises a 'heater' layer, such as TiN. When certain current flows through the heater layer 1106, heat is generated to change the phase-change layer 1105 between amorphous and crystalline phases. It should be noted that the number of layers and corresponding structures described above are exemplary and that other configurations can be utilized. For example, each of the resistive layer 1105 and the phase-change layer 1106 may contain more than two layers, depending on the process and technology.

Figure 11F:
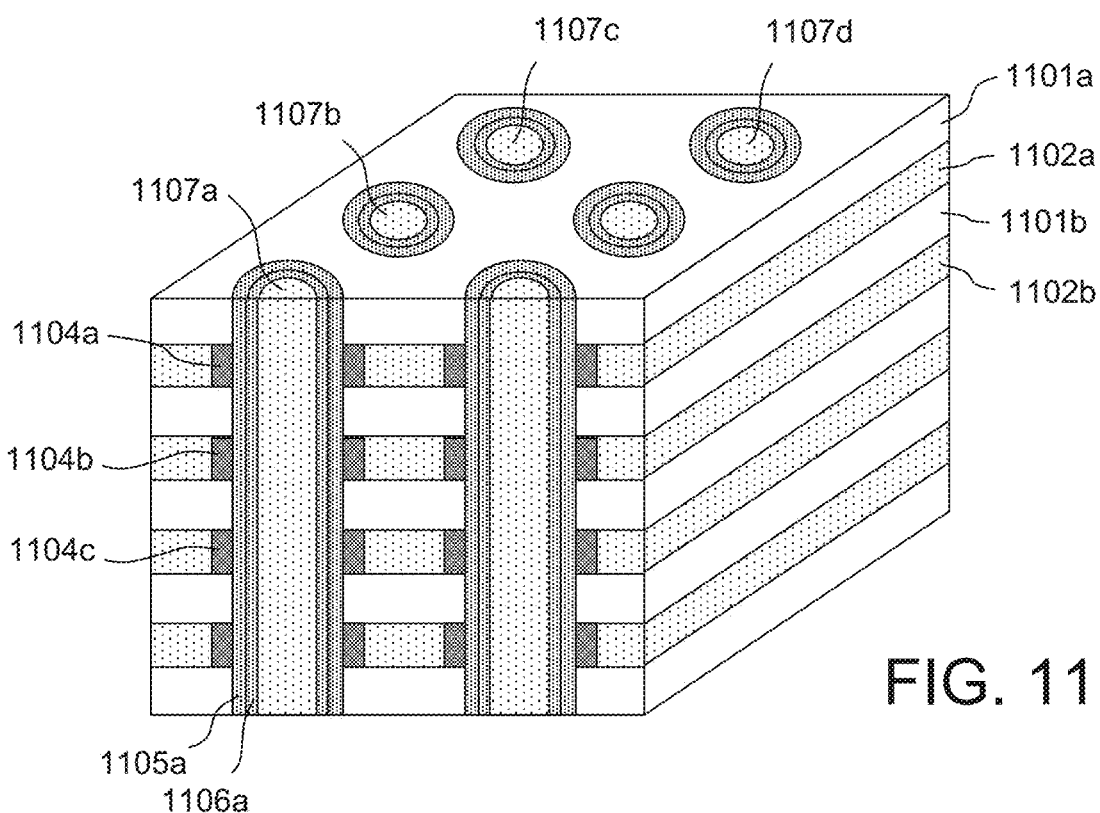

FIG. 11F illustrates the stack shown in FIG. 11E in which conductor layers 1107*a-d* are deposited to fill the remaining smaller holes (e.g., remaining open regions of the holes 1103 after the layers 1105/1106 are deposited). In an exemplary embodiment, the conductor layers 1107 comprise at least one of platinum (Pt), tantalum (Ta), titanium (Ti), aluminum (Al), copper (Cu), tungsten (W), nickel (Ni), chromium (Cr), praseodymium (Pr), ruthenium (Ru), silver (Ag), polysilicon, or other suitable materials.

For non-volatile memory application, the horizontal conductor layers 1102 can be used as word lines, and the vertical conductor layers 1107 can be used as bit lines. Placing the appropriate voltages on these layers allows the resistive material 1105/1106 to be programmed or erased. The selector devices 1104 prevent leakage currents. In another embodiment, the word lines and bit lines associated with the layer 1102 and 1107 are exchanged.

For neural network applications, the horizontal conductor layers, such as layers 1102*a* and 1102*b*, can be used as input connections of synapses or neurons, and the vertical conductor layers, such as 1107*a* and 1107*b*, can be used as the output connections of the synapses or neurons. In another embodiment, the input connections and output connections may be exchanged.

FIGS. 12A-F show novel 3D array structures and associated process steps.

Figure 12A:
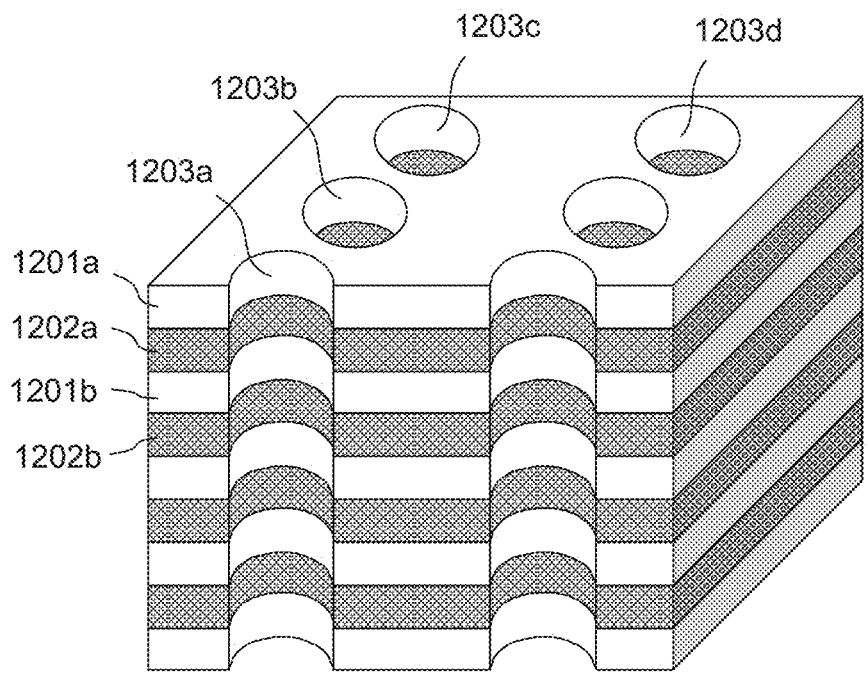
FIGS. 12A-H shows novel 3D array structures and associated process steps.

FIG. 12A shows an exemplary embodiment of a stack comprising multiple insulating layers, such as 1201*a-b*, and multiple sacrificial layers, such as 1202*a-b*, that are alternatively deposited to form the stack. In an exemplary embodiment, multiple bit line holes, such as 1203*a-d*, are formed by a trench process to etch through the multiple insulating layers 1201 and sacrificial layers 1202 of the stack.

Figure 12B:
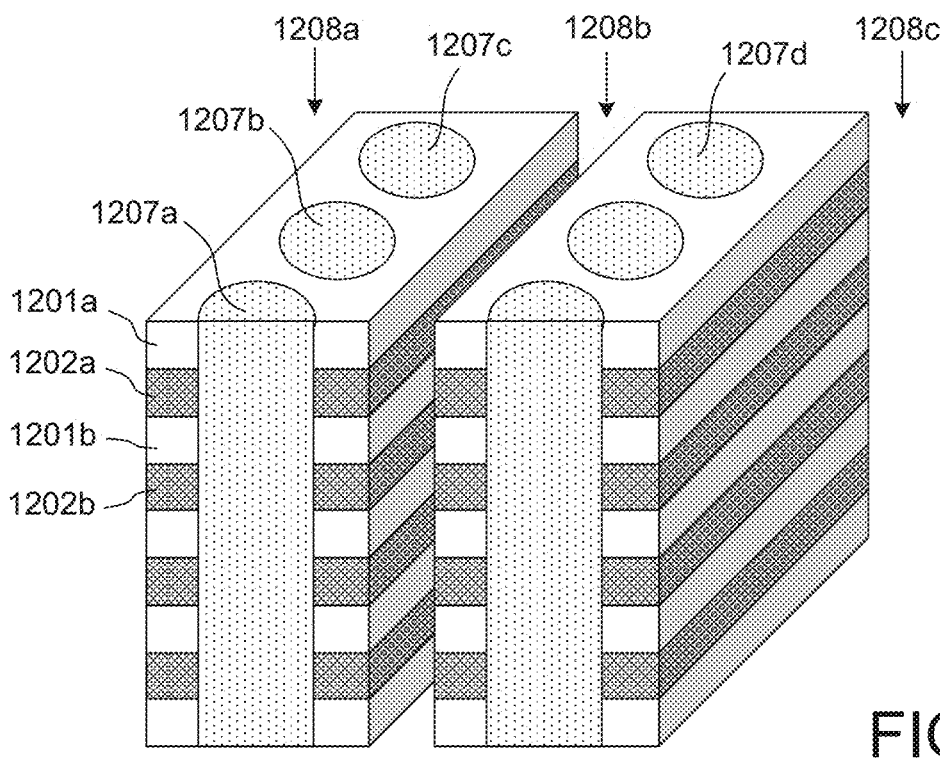

FIG. 12B shows the stack of FIG. 12A and illustrates how the bit line holes 1203 are filled with conductor material, such as metal, to form vertical bit lines such as 1207*a-d*. In another operation, vertical slits, such as 1208*a-c* are etched through the multiple insulating layers 1201 and sacrificial layers 1202 (stack) to form two sections. It should be noted that depending on the size of the stack, additional slits could be etched to form more than two sections.

Figure 12C:
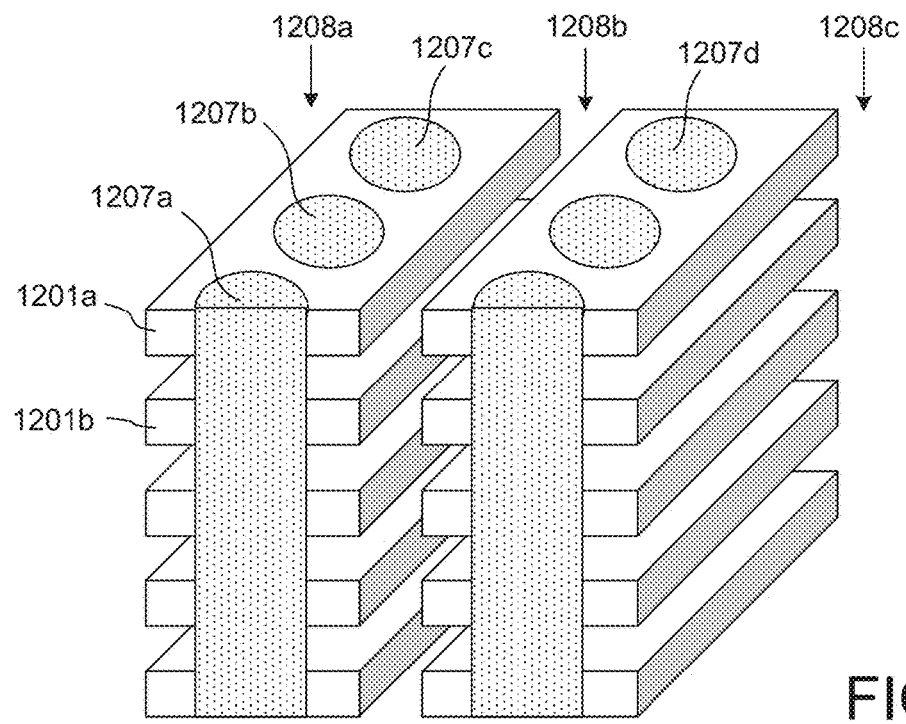

FIG. 12C shows the stack of FIG. 12B and illustrates that the sacrificial layers 1202 have been removed by using an isotropic etching process through the slits 1208. This leaves only the insulating layers 1201 and the vertical bit lines 1207.

Figure 12D:
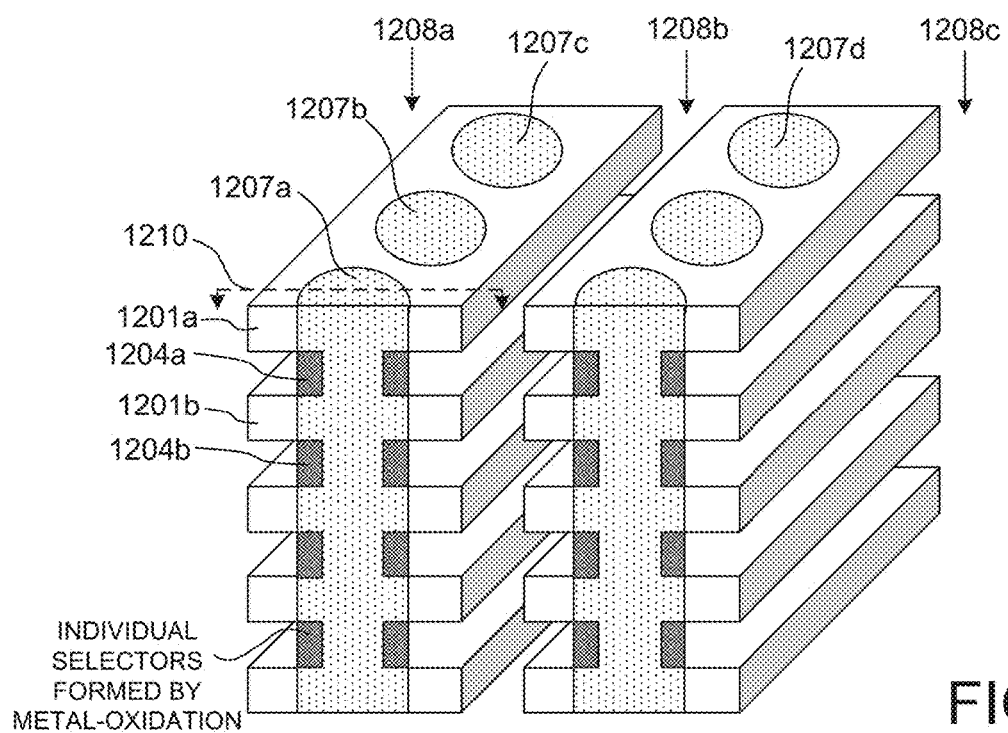

FIG. 12D shows the stack of FIG. 12C and illustrates how a metal-oxidation process is performed through the slits 1208 to form a metal-oxide selector devices, such as 1204*a-b*, on the exposed surfaces of the bit lines 1207. A cross-section indicator 1210 indicate a location of a cross-sectional view that is discussed below.

Figure 12E:
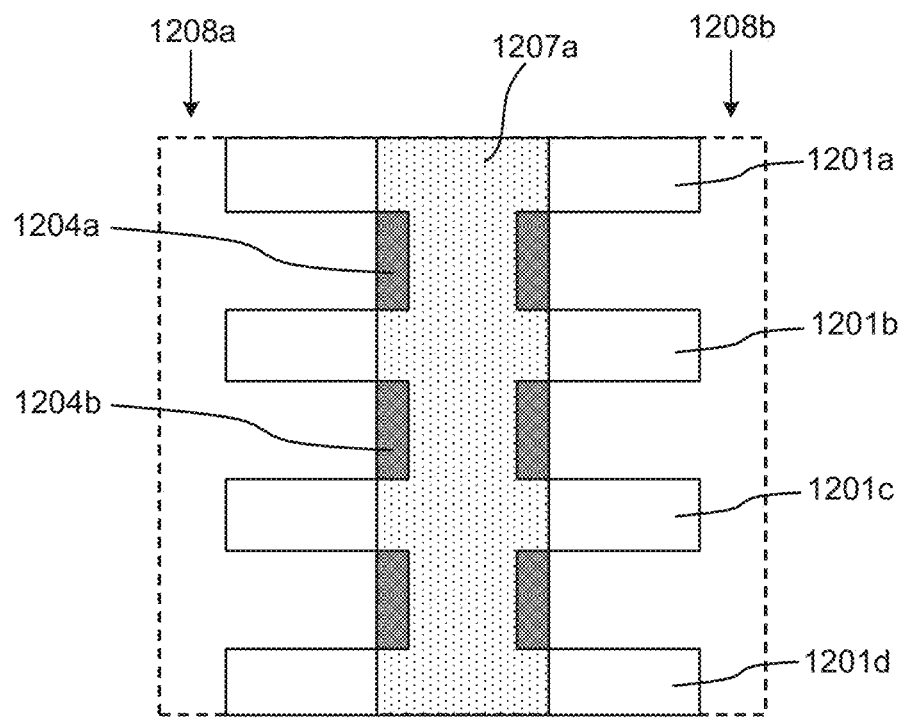

FIG. 12E shows an exemplary embodiment of a cross-section view of the stack shown in FIG. 12D. The cross-section view is taken along the bit line 1207*a* as indicated by cross-section indicator 1210. This view illustrates the bit line 1207a, metal-oxide regions 1204 and external surfaces of the insulating layers 1201.

Figure 12F:
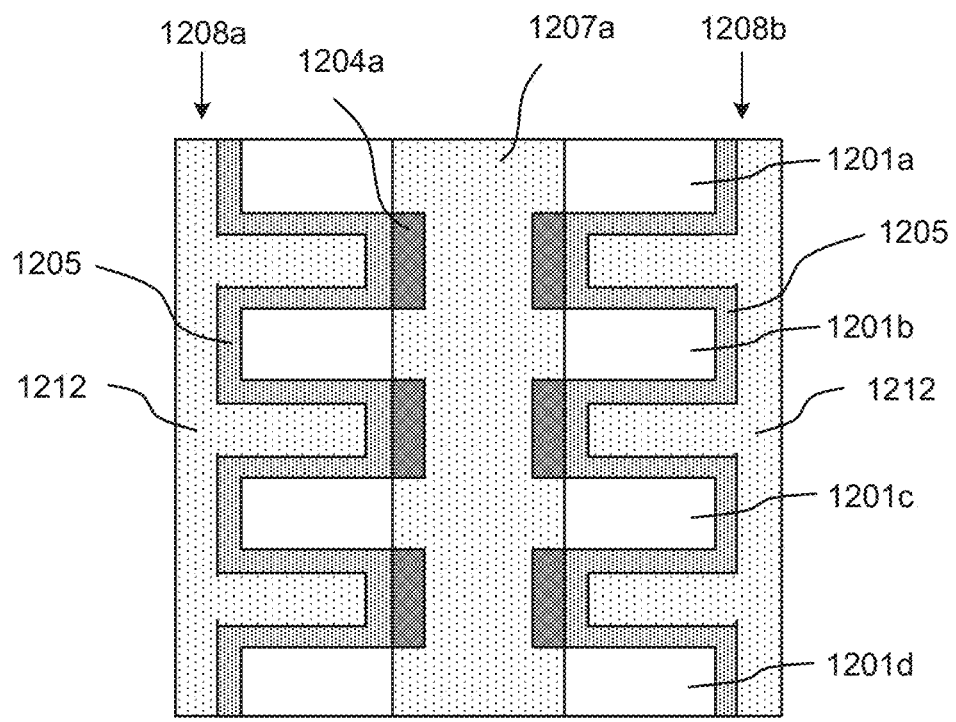

FIG. 12F shows the cross-section view of FIG. 12E and illustrates how a resistive material layer or phase-change material layer 1205 is deposited on the surface of the sidewalls through the slits 1208a and 1208b. In an exemplary embodiment, the material 1205 is deposited over the exposed surfaces of the metal-oxide regions 1204, and the exposed surfaces of the insulating layers 1201 as illustrated in FIG. 12F. The layers 1205 may contain a single layer or multiple layers as discuss above with respect to layers 1105/1106. After this operation, the slits 1208a-b are filled with a conductor material, such as metal 1212.

Figure 12G:
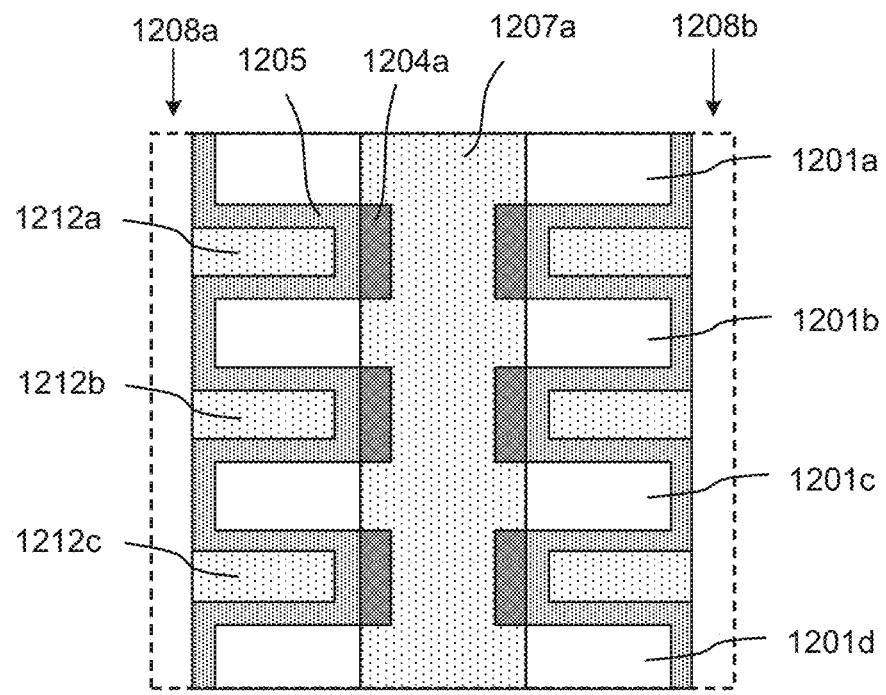

FIG. 12G shows the cross-section view of FIG. 12F and illustrates how an anisotropic etch process is performed at the slits 1208a and 1208b to remove the vertical portions of the conductor 1212 and form horizontal word lines such as 1212a-c. The slits 1208a and 1208b can be filled with insulating material such as oxide. This completes the cell structure.

Figure 12H:
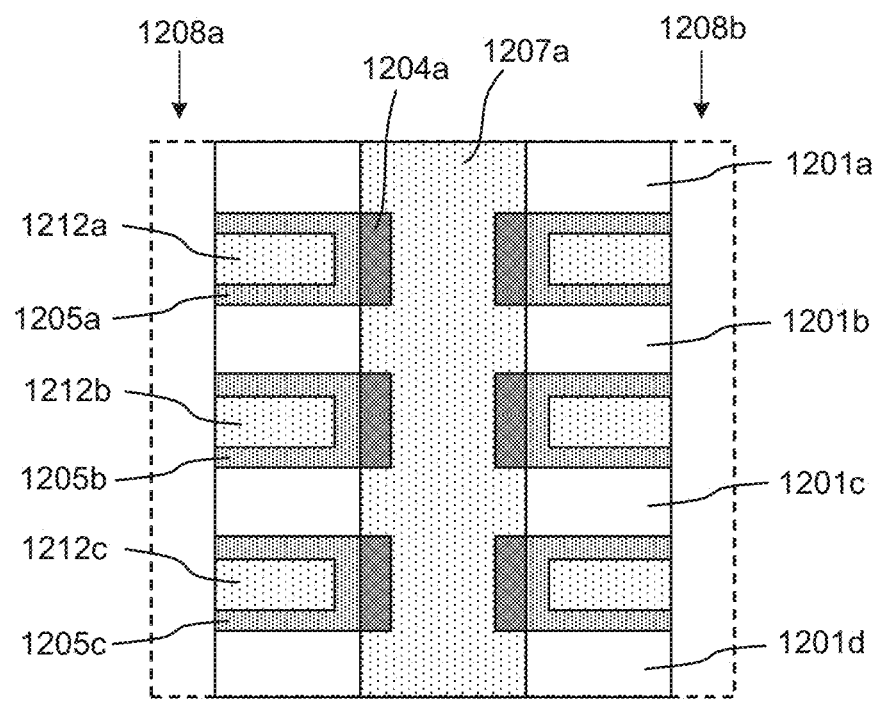

FIG. 12H shows another embodiment of the cell structure shown in FIG. 12G that illustrates the anisotropic etching process is performed at the slits 1208a and 1208b to remove portions of the conductor layer 1212, where the vertical portions of the resistive material layer or phase-change material layer 1205 are also removed to form the individual resistive layers or phase-change material layers, such as 1205a-c.

Thus, for non-volatile memory application, the horizontal conductor layers 1212 can be used as word lines, and the vertical conductor layers 1207 can be used as bit lines. Placing the appropriate voltages on these layers allows the resistive material 1205 to be programmed or erased. The selector devices 1204 prevent leakage currents. In another embodiment, the word lines and bit lines are exchanged or reversed.

FIGS. 13A-D show novel 3D array structures and associated process steps.

Figure 13A:
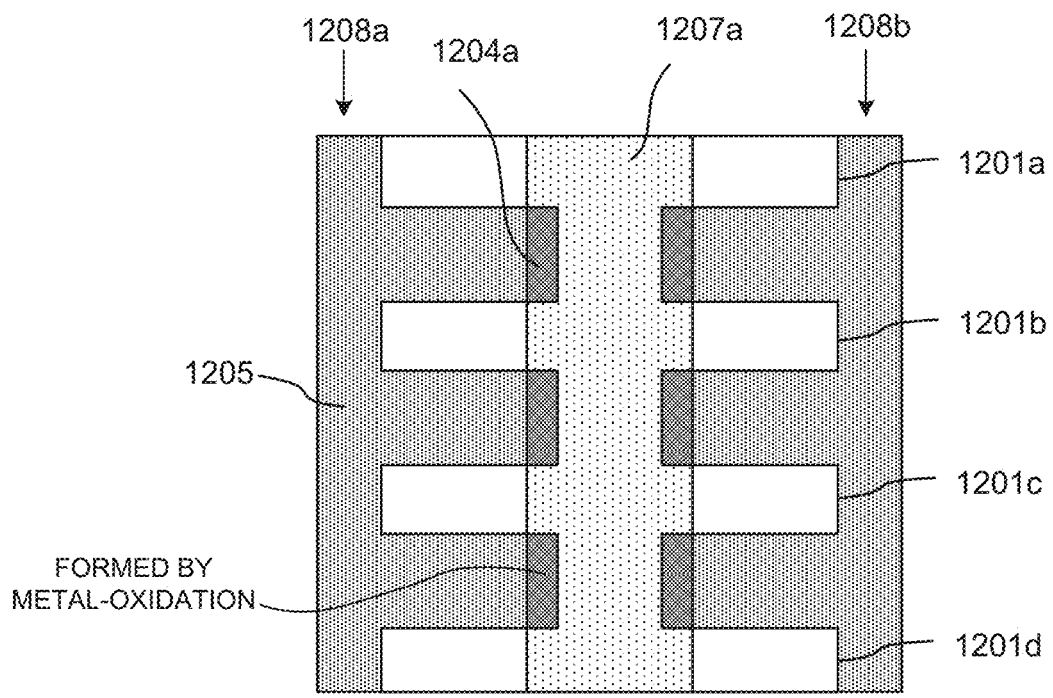
FIGS. 13A-D shows novel 3D array structures and associated process steps.

FIG. 13A shows the cross-section view of the stack shown in FIG. 12D. After the process step in FIG. 12D, the slits 1208a and 1208b are filled with resistive material or phase-change material 1205.

Figure 13B:
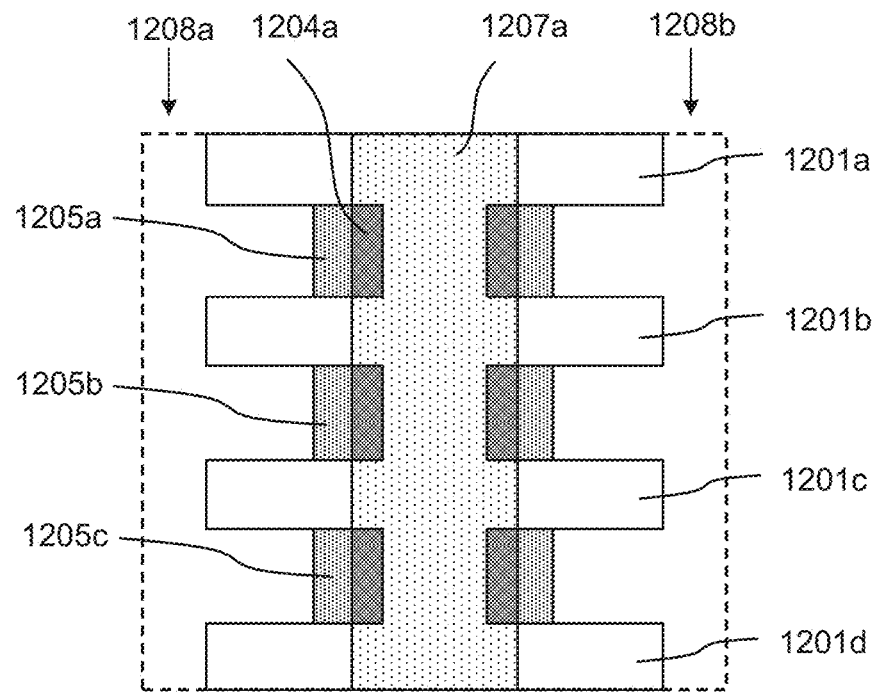

FIG. 13B shows the cross-section view of the stack shown in FIG. 13A. An isotropic etching process is performed to etch the resistive material or phase-change material 1205 to form the individual resistive layers or phase-change material layer such as 1205a-c as shown in FIG. 13B.

Figure 13C:
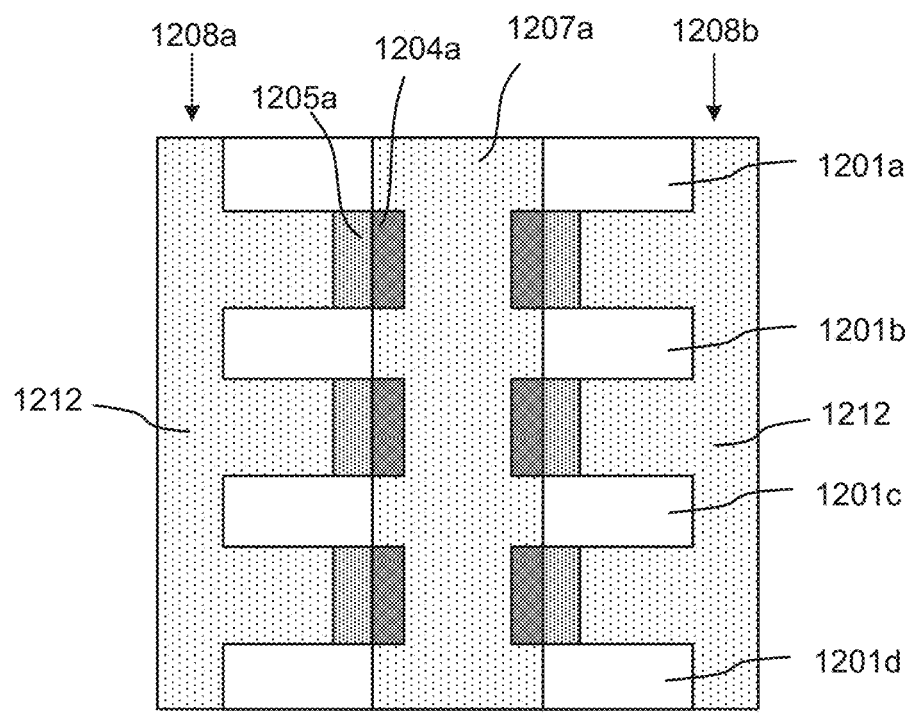

FIG. 13C shows the cross-section view of the stack shown in FIG. 13B. The slits 1208a and 1208b are filled with conductor, such as a metal 1212.

Figure 13D:
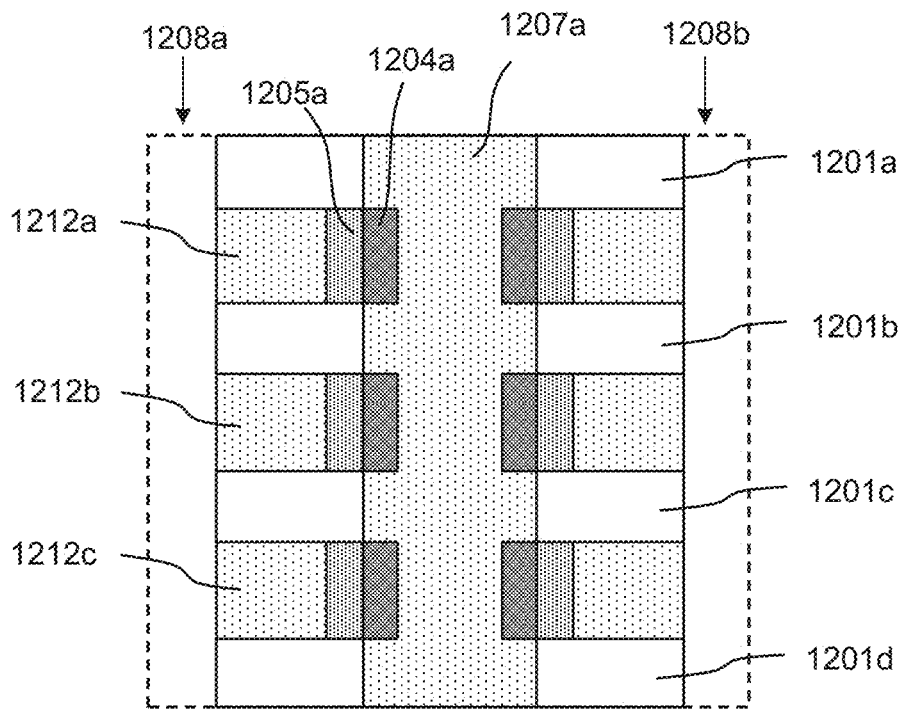

FIG. 13D shows the cross-section view of the stack shown in FIG. 13C. An anisotropic etch process is performed through the slits 1208a and 1208b to remove the vertical portion of the conductor 1212 and form horizontal word lines such as 1212a-c. The slits 1208a and 1208b can be filled with insulating material, such as oxide to complete the cell structure.

Figure 14:
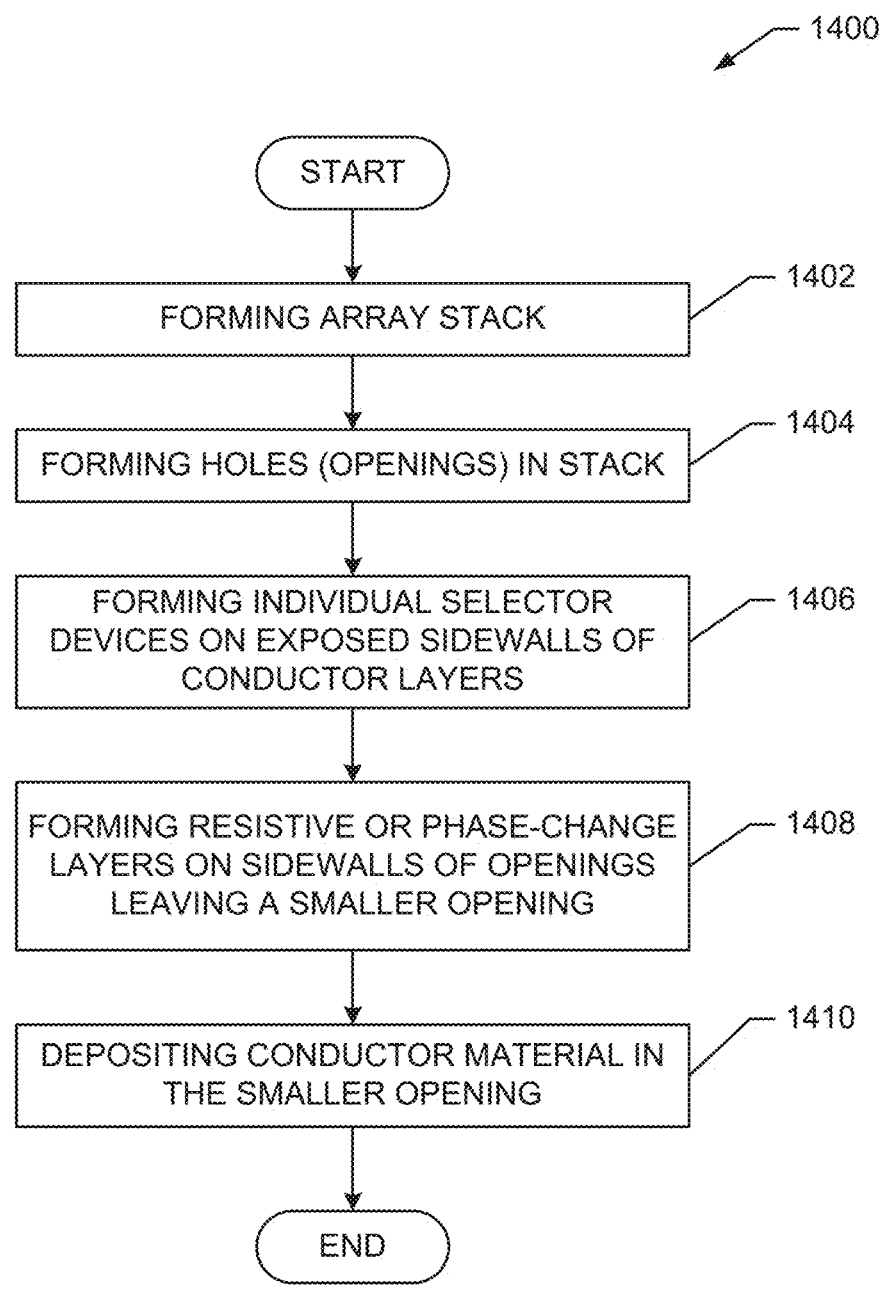
FIG. 14 shows an exemplary embodiment of method for forming the array structures shown in FIG. 11.

FIG. 14 shows an exemplary embodiment of method 1400 to form 3D array structures. In an exemplary embodiment, the method 1400 is suitable for use to form the novel cell structures above described with reference to FIGS. 11A-F.

At block 1402, an array stack is formed. In an exemplary embodiment, multiple insulator layers, such as 1101a and 1101b, and multiple conductor layers, such as 1102a and 1102b, are deposited to form a stack as illustrated in FIG. 11A.

At block 1404, holes or openings are formed in the array stack. For example, the array stack is etched to produce multiple vertical holes (or openings), such as holes 1103a-d as shown in FIG. 11B.

At block 1406, selector devices are formed on exposed surface of conductor layers. For example, selector devices, such as 1104a-c are formed on the exposed sidewalls of the holes 1103a-d in locations where the conductor layers, such as 1102a-b, are exposed as illustrated in FIG. 11C. In an exemplary embodiment, the selector devices 1104 are formed by metal-oxidation of the exposed surfaces of the conductor layers 1102 within the holes 1103. These metal-oxide layers perform with threshold behavior like Schottky diodes.

At block 1408, resistive or phase-change layers are formed on the sidewalls of the openings. For example, resistive layers or phase-change layers, such as 1105a-d, that are formed on the sidewall of the holes 1103 as illustrated in FIG. 11D. In an exemplary embodiment, the resistive layers 1105 comprise multiple layers. For example, the resistive or phase change layers are deposited over the exposed surfaces of the selector devices 1104 and the insulator layers 1101 within each of the holes 1103. In an exemplary embodiment, the depositing of the resistive or phase change layers does not completely fill each of the holes 1103 such that a smaller hole or opening through the array stack is formed.

At block 1414, conductor material is deposited in empty regions of the openings. For example, conductor layers 1107a-d are deposited to fill the remaining open regions of the holes 1103 as illustrated in FIG. 11F. For example, the depositing of the resistive or phase change layers does not completely fill each of the holes 1103 such that a smaller hole or opening through the array stack is formed. This smaller opening is filled with the conductor layers 1107.

Thus, the method 1400 operates to form a novel cell structure that includes selector devices formed by metal-oxidation. It should be noted that the method 1400 is exemplary and that the disclosed operations may be combined, rearranged, added to, deleted, and/or modified within the scope of the embodiments.

Figure 15:
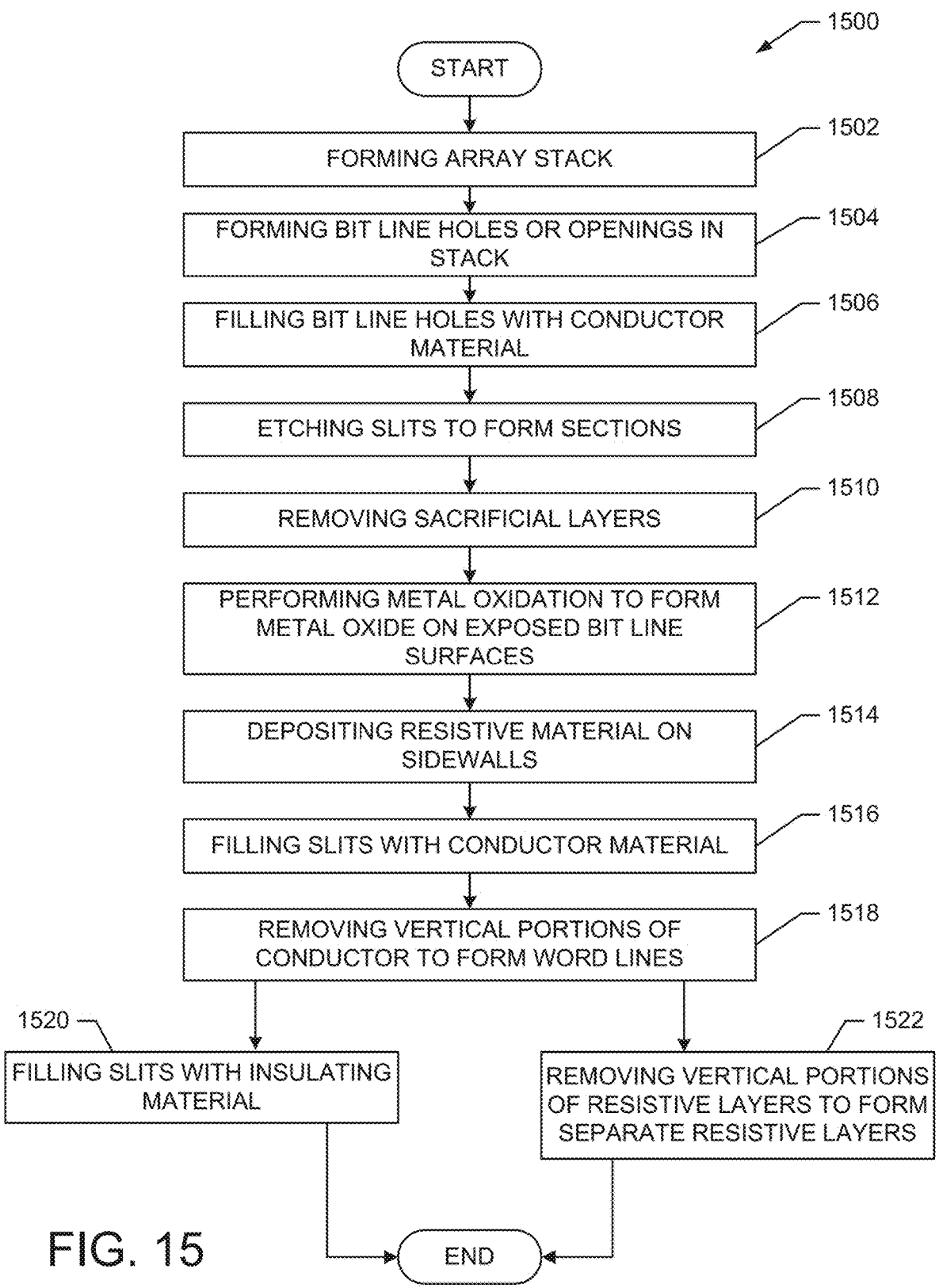
FIG. 15 shows an exemplary embodiment of method for forming the array structures shown in FIG. 12.

FIG. 15 shows an exemplary embodiment of method 1500 to form 3D array structures. In an exemplary embodiment, the method 1500 is suitable for use to form the novel cell structures above described with reference to FIGS. 12A-F.

At block 1502, an array stack is formed. For example, the array stack comprises multiple insulating layers, such as 1201a-b, and multiple sacrificial layers, such as 1202a-b, that are alternatively deposited to form the stack as illustrated in FIG. 12A.

At block 1504, bit line holes or openings are formed in the array stack. For example, multiple bit line holes, such as 1203a-d, are formed by a trench process to etch through the multiple insulating layers 1201 and sacrificial layers 1202 of the stack as illustrated in FIG. 12A.

At block 1506, the bit line holes are filled with conductor material. For example, the bit line holes 1203 are filled with conductor material, such as metal, to form vertical bit lines such as 1207a-d as illustrated in FIG. 12B.

At block 1508, slits are etched into the array stack to form stack sections. For example, vertical slits, such as 1208a-c are etched through the multiple insulating layers 1201 and sacrificial layers 1202 to form stack sections as illustrated in FIG. 12B.

At block 1510, sacrificial layers are removed from the stack sections. For example, the sacrificial layers 1202 have been removed from the stack sections using an isotropic etching process through the slits 1208 as illustrated in FIG. 12C.

At block 1512, a metal oxide is formed on exposed bit line surfaces. For example, a metal-oxidation process is performed through the slits 1208 to form a metal-oxide, such as 1204a-b, on the exposed surfaces of the bit lines 1207 as illustrated in FIG. 12D. This metal-oxide acts as a selector device as described above. For example, these metal-oxide layers perform with threshold behavior like Schottky diodes.

At block 1514, resistive material is deposited on the sidewalls. For example, a resistive material layer or phase-change material layer 1205 is deposited on the surface of the sidewalls through the slits 1208a and 1208b as illustrated in FIG. 12E.

At block 1516, the slits are filled with conductor material. For example, the slits are filled with a conductor, such as metal 1212 as illustrated in FIG. 12F.

At block 1518, vertical portions of the conductor material is removed to form word lines. For example, an anisotropic etch process is performed through the slits 1208a and 1208b to remove the vertical portion of the conductor 1212 and form horizontal word lines such as 1212a-c as illustrated in FIG. 12G.

At block 1520, in one embodiment, the slits are filled with an insulating material. For example, the slits 1208a and 1208b are filled with insulating material, such as oxide, as illustrated in FIG. 12G.

At block 1522, in one embodiment, vertical portions of resistive layers are removed to form separate resistive layers. For example, an anisotropic etching process of the conductor layer 1212 is performed where vertical portions of the resistive material layer or phase-change material layer 1205 are also removed to form the individual resistive layers or phase-change material layers such as 1205a and 1205b for each cell as illustrated in FIG. 12H.

Thus, the method 1500 operates to form a novel cell structure that includes selector devices formed by metal-oxidation. It should be noted that the method 1500 is exemplary and that the disclosed operations may be combined, rearranged, added to, deleted, and/or modified within the scope of the embodiments.

Figure 16:
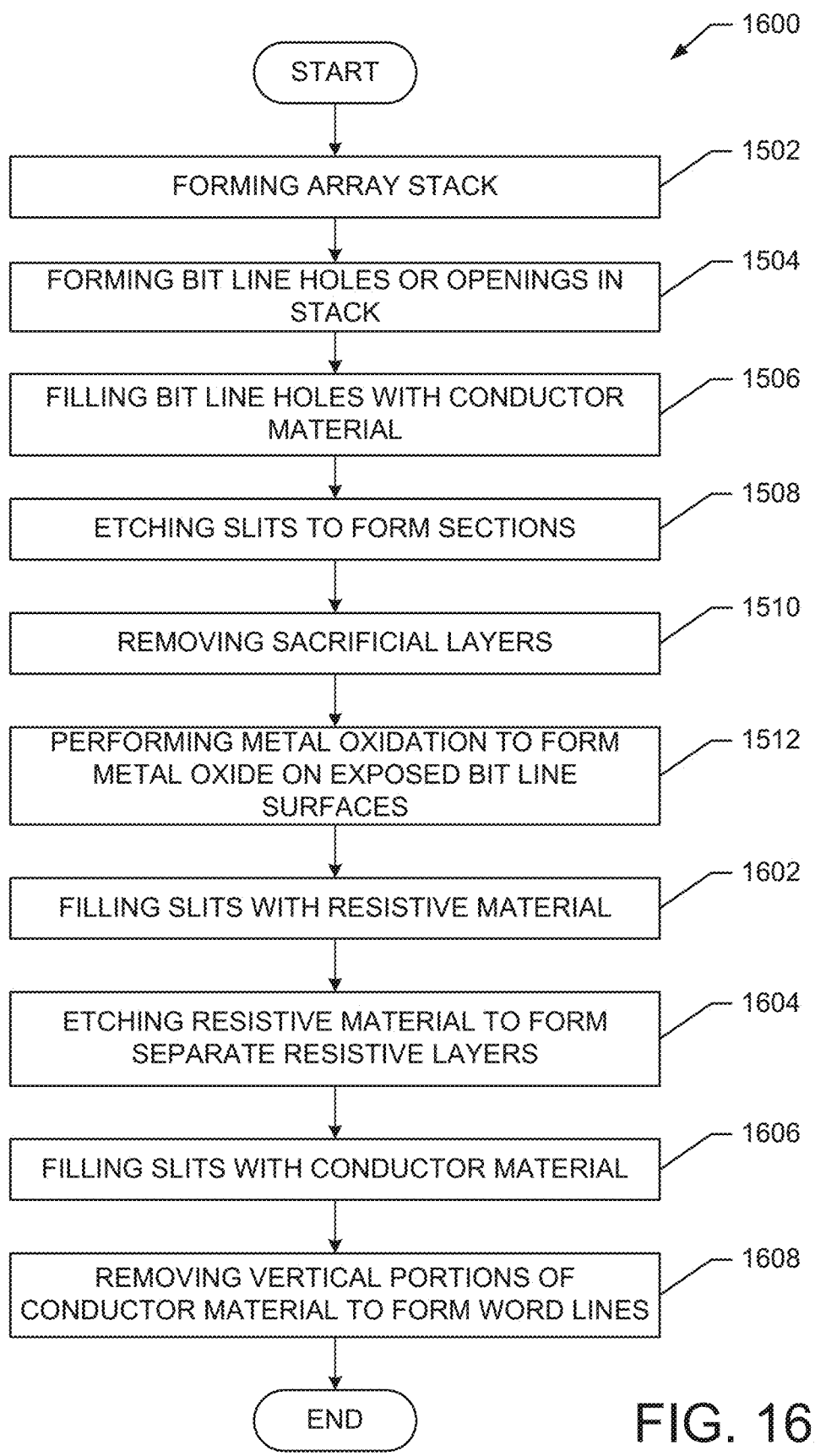
FIG. 16 shows an exemplary embodiment of method for forming the array structures shown in FIG. 13.

FIG. 16 shows an exemplary embodiment of method 1600 to form 3D array structures. In an exemplary embodiment, the method 1600 is suitable for use to form the novel cell structures above described with reference to FIGS. 13A-D. As shown in FIG. 16, the operations 1502-1512 are the same as those described with reference to FIG. 15 and therefore the descriptions of these operations are not repeated here. After the operations 1502-1512, the method 1600 continues with block 1602 as below described.

At block 1602, the slits are filled with resistive material. For example, the slits 1208a and 1208b are filled with resistive material or phase-change material layer 1205 as illustrated in FIG. 13A.

At block 1604, the resistive material is etched to form separate resistive layers. For example, an isotropic etching process is performed to etch the resistive material or phase-change material 1205 to form the individual resistive layers or phase-change material layers such as 1205a-c as illustrated in FIG. 13B.

At block 1606, the slits with conductor material. For example, the slits 1208a and 1208b are filled with conductor, such as a metal 1212, as illustrated in FIG. 13C.

At block 1608, vertical portions of conductor material is removed to form word lines. For example, an anisotropic etch process is performed through the slits 1208a and 1208b to remove the vertical portion of the conductor 1212 and form horizontal word lines such as 1212a-c as illustrated in FIG. 13D.

Thus, the method 1600 operates to form a novel cell structure that includes selector devices formed by metal-oxidation. It should be noted that the method 1600 is exemplary and that the disclosed operations may be combined, rearranged, added to, deleted, and/or modified within the scope of the embodiments.

While exemplary embodiments of the present invention have been shown and described, it will be obvious to those with ordinary skills in the art that based upon the teachings herein, changes and modifications may be made without departing from the exemplary embodiments and their broader aspects. Therefore, the appended claims are intended to encompass within their scope all such changes and modifications as are within the true spirit and scope of the exemplary embodiments of the present invention.

What is claimed is:

1. A 3D vertical memory array structure formed by performing operations comprising:
   forming an array stack comprising alternating metal layers and insulator layers;
   forming a hole through the array stack to expose internal surfaces of the metal layers and internal surfaces of the insulator layers;
   performing a metal-oxidation process on the internal surfaces of the metal layers to form an individual metal-oxide segment as a selector device on the internal surface of each metal layer, respectively;
   depositing one of resistive material or phase-change material within the hole and directly onto the selector devices and directly onto the internal surfaces of the insulator layers, and wherein the hole is reduced to a smaller hole; and
   depositing conductor material in the smaller hole.

2. The structure of claim 1, wherein the operation of forming the hole comprises etching the hole through the array stack.

3. The structure of claim 1, wherein the metal layers comprise a selected one of Tantalum (Ta), Niobium (Nb), Titanium (Ti), Zirconium (Zr), Vanadium-Chromium (VCr) and the operation of performing the metal-oxidation process comprises performing the metal-oxidation process to form a selected one of TaOx, NbOx, TiOX, ZrOx, or VCrOx layers on the internal surfaces of the metal layers.

4. The structure of claim 1, wherein the resistive material comprises one of HfOx, LiSiOx, ZrSiOx, WOx, TaOx, NbOx, TiOx, AlOx, NiOx, ZrOx, CuOx, CrOx, MnOx, MoOx, and SiOx material, and the operation of depositing the resistive material comprises performing a thin film deposition of the resistive material.

5. The structure of claim 1, wherein the operation of depositing the resistive material comprises depositing multiple layers of the resistive material, wherein a first layer is formed from HfOx and a second layer is formed from AlOx or PtOx.

6. The structure of claim 1, wherein the operation of depositing the phase-change material comprises depositing a first layer of phase-change material and the second layer of heater material.

7. The structure of claim 1, wherein the operation of depositing the conductor material in the smaller hole comprises depositing one of platinum (Pt), tantalum (Ta), titanium (Ti), aluminum (Al), copper (Cu), tungsten (W), nickel (Ni), chromium (Cr), praseodymium (Pr), ruthenium (Ru), silver (Ag), or polysilicon material into the smaller hole.

8. A 3D vertical memory array structure formed by performing operations comprising:
   forming an array stack comprising alternating metal layers and insulator layers;
   forming a hole through the array stack to expose internal surfaces of the metal layers and internal surfaces of the insulator layers;
   performing a metal-oxidation process on the internal surfaces of the metal layers to form an individual metal-oxide segment as a selector device on the internal surfaces of each metal layer;
   depositing a first layer of phase-change material and a second layer of heater material within the hole and directly onto the selector devices and directly onto the internal surfaces of the insulator layers, and wherein the hole is reduced to a smaller hole; and
   depositing conductor material in the smaller hole.

9. The structure of claim 8, wherein the operation of forming the hole comprises etching the hole through the array stack.

10. The structure of claim 8, wherein the metal layers comprise a selected one of Tantalum (Ta), Niobium (Nb), Titanium (Ti), Zirconium (Zr), Vanadium-Chromium (VCr) and the operation of performing the metal-oxidation process comprises performing the metal-oxidation process to form a selected one of TaOx, NbOx, TiOX, ZrOx, or VCrOx layers on the internal surfaces of the metal layers.

11. The structure of claim 8, wherein the phase-change material comprises chalcogenide.

12. The structure of claim 8, wherein the heater layer material comprises TiN.

13. A 3D vertical memory array structure formed by performing operations comprising:
   forming an array stack comprising alternating metal layers and insulator layers;
   forming a hole through the array stack to expose internal surfaces of the metal layers and internal surfaces of the insulator layers;
   performing a metal-oxidation process on the internal surfaces of the metal layers to form an individual metal-oxide segment as a selector device on the internal surfaces of each metal layer;
   depositing multiple layers of the resistive material, wherein a first layer is formed from HfOx and a second layer is formed from AlOx or PtOx, within the hole and directly onto the selector devices and directly onto the internal surfaces of the insulator layers, and wherein the hole is reduced to a smaller hole; and
   depositing conductor material in the smaller hole.

14. The structure of claim 13, wherein the operation of forming the hole comprises etching the hole through the array stack.

15. The structure of claim 13, wherein the metal layers comprise a selected one of Tantalum (Ta), Niobium (Nb), Titanium (Ti), Zirconium (Zr), Vanadium-Chromium (VCr) and the operation of performing the metal-oxidation process comprises performing the metal-oxidation process to form a selected one of TaOx, NbOx, TiOX, ZrOx, or VCrOx layers on the internal surfaces of the metal layers.

16. The structure of claim 13, wherein the resistive material comprises one of HfOx, LiSiOx, ZrSiOx, WOx, TaOx, NbOx, TiOx, AlOx, NiOx, ZrOx, CuOx, CrOx, MnOx, MoOx, and SiOx material, and the operation of depositing the resistive material comprises performing a thin film deposition of the resistive material.

17. The structure of claim 13, wherein the operation of depositing the conductor material in the smaller hole comprises depositing one of platinum (Pt), tantalum (Ta), titanium (Ti), aluminum (Al), copper (Cu), tungsten (W), nickel (Ni), chromium (Cr), praseodymium (Pr), ruthenium (Ru), silver (Ag), or polysilicon material into the smaller hole.

* * * * *